US012707766B2

(12) United States Patent
Kim et al.

(10) Patent No.: US 12,707,766 B2
(45) Date of Patent: Aug. 11, 2026

(54) DISPLAY DEVICE WITH DIFFERING CONTACT HOLE SIZES AND METHOD OF FABRICATING THE SAME

(71) Applicant: Samsung Display Co., LTD., Yongin-si (KR)

(72) Inventors: Seul Ki Kim, Incheon (KR); Kwang Soo Lee, Gwangmyeong-si (KR); Jae Hyun Lee, Gwacheon-si (KR); Seung Ha Choi, Hwaseong-si (KR); Jong Bum Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 791 days.

(21) Appl. No.: 17/872,948

(22) Filed: Jul. 25, 2022

(65) Prior Publication Data

US 2023/0062993 A1 Mar. 2, 2023

(30) Foreign Application Priority Data

Aug. 26, 2021 (KR) .................. KR10-2021-0113150

(51) Int. Cl.

| | |
|---|---|
| ***H10H 20/01*** | (2025.01) |
| ***H10H 20/831*** | (2025.01) |
| ***H10H 20/857*** | (2025.01) |

(52) U.S. Cl.

CPC ........ *H10H 20/8312* (2025.01); *H10H 20/01* (2025.01); *H10H 20/857* (2025.01); *H10H 20/032* (2025.01); *H10H 20/0364* (2025.01)

(58) Field of Classification Search

CPC ........................ H10H 20/8312; H10D 86/441; H01L 25/167; H01L 25/0753

See application file for complete search history.

(56) References Cited

U.S. PATENT DOCUMENTS 6,362,938 B1 * 3/2002 Suzuki ................. G11B 5/5552
8,816,579 B2 * 8/2014 Kim ................ H10K 59/80517 313/504

(Continued)

FOREIGN PATENT DOCUMENTS

KR 10-2017-0013553 A 2/2017
KR 2019-0063230 A 6/2019

(Continued)

*Primary Examiner* — William B Partridge
*Assistant Examiner* — Mehek Ahmed
(74) *Attorney, Agent, or Firm* — Womble Bond Dickinson (US) LLP

(57) ABSTRACT

A display device includes: a substrate; a first conductive layer on the substrate and including a first pattern; a first insulating layer on the first conductive layer; a semiconductor layer on the first insulating layer and including an active pattern; a second insulating layer on the semiconductor layer; and a second conductive layer on the second insulating layer, wherein the second conductive layer includes a first electrode partially in contact with the active pattern, the first electrode is in contact with the first pattern through a first contact hole, the first contact hole penetrates the first insulating layer and includes a first hole defined by a sidewall of the first insulating layer, and a second hole defined by a sidewall of the active pattern and a sidewall of the second insulating layer, and a width of the second hole is greater than a width of the first hole.

20 Claims, 32 Drawing Sheets

(56) References Cited

U.S. PATENT DOCUMENTS

| | | | | |
|---|---|---|---|---|
| 10,014,356 | B2 * | 7/2018 | Seo | H10D 86/451 |
| 11,402,715 | B2 | 8/2022 | Hong et al. | |
| 11,550,188 | B2 * | 1/2023 | Higuchi | G02F 1/1339 |
| 2006/0289866 | A1 * | 12/2006 | Araki | H10D 86/451<br>438/149 |
| 2019/0305117 | A1 * | 10/2019 | Sasaki | H10D 30/6757 |
| 2020/0110316 | A1 * | 4/2020 | Kunimatsu | G02F 1/133711 |
| 2022/0254830 | A1 * | 8/2022 | Kim | H10H 20/831 |
| 2022/0375906 | A1 * | 11/2022 | Kim | G09G 3/32 |
| 2022/0392966 | A1 | 12/2022 | Lee et al. | |
| 2023/0045618 | A1 * | 2/2023 | Kim | H10H 20/832 |
| 2023/0062993 | A1 * | 3/2023 | Kim | H10H 20/8312 |

FOREIGN PATENT DOCUMENTS

| | | | |
|---|---|---|---|
| KR | 2020-0078094 | A | 7/2020 |
| KR | 10-2021-0074561 | A | 6/2021 |
| KR | 10-2022-0164104 | A | 12/2022 |

* cited by examiner

110: 111, 112, 113
120: ACT, 121
130: 131, 132, 133

110: 111, 112, 113
120: ACT', 121

110: 111, 112, 113
120: ACT', 121

110: 111, 112, 113
120: ACT', 121

110: 111, 112, 113
120: ACT', 121

110: 111, 112, 113
120: ACT, 121
130: 131, 132, 133

DISPLAY DEVICE WITH DIFFERING CONTACT HOLE SIZES AND METHOD OF FABRICATING THE SAME

CROSS-REFERENCE TO RELATED APPLICATION

The present application claims priority to and the benefit of Korean Patent Application No. 10-2021-0113150 filed on Aug. 26, 2021, in the Korean Intellectual Property Office (KIPO), the entire content of which is incorporated herein by reference.

BACKGROUND

1. Field

Aspects of some embodiments of the present disclosure relate to a display device and a method of fabricating the same.

2. Description of the Related Art

The importance of display devices has steadily increased with the development of multimedia technology. In response thereto, various types of display devices such as an organic light emitting display (OLED), a liquid crystal display (LCD) and the like have been used. Such display devices may be variously applied to a variety of electronic products such as televisions, smart phones, smart watches, and tablet PCs.

Display devices generally include a plurality of transistors. Each transistor may include a gate electrode, a source/drain electrode, and a semiconductor layer. In order to simplify the fabricating process of the display device, the gate electrode and the source/drain electrode included in the display device may be formed of the same conductive layer.

The above information disclosed in this Background section is only for enhancement of understanding of the background and therefore the information discussed in this Background section does not necessarily constitute prior art.

SUMMARY

Aspects of some embodiments of the present disclosure include a display device including a first conductive layer and a second conductive layer which is on the first conductive layer, in which both a gate electrode and a source/drain electrode are made of the second conductive layer, and a sidewall of an insulating layer defining a contact hole interconnecting the first and second conductive layers has a positive taper shape, and a method of fabricating the display device.

Aspects of some embodiments of the present disclosure also include a display device that minimizes or reduces damage to a semiconductor layer and a method of fabricating the display device.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to some embodiments of the present disclosure, a display device includes a substrate, a first conductive layer on the substrate and including a first pattern, a first insulating layer on the first conductive layer, a semiconductor layer on the first insulating layer and including an active pattern, a second insulating layer on the semiconductor layer, and a second conductive layer on the second insulating layer. The second conductive layer includes a first electrode partially in contact with the active pattern. The first electrode is in contact with the first pattern through a first contact hole. The first contact hole penetrates the first insulating layer and includes a first hole defined by a sidewall of the first insulating layer, and a second hole defined by a sidewall of the active pattern and a sidewall of the second insulating layer. A width of the second hole is greater than a width of the first hole.

According to some embodiments, the active pattern may expose a portion of a top surface of the first insulating layer in a region around the first hole. The first electrode may be in contact with a top surface of the first insulating layer exposed by the active pattern.

According to some embodiments, a sidewall of the second insulating layer defining the second hole may be on a top surface of the first insulating layer exposed by the active pattern in a region around the first hole. A top surface of the first insulating layer exposed by the active pattern may be between a sidewall of the first insulating layer defining the first hole and a sidewall of the second insulating layer defining the second hole in a plan view.

According to some embodiments, the second insulating layer may expose a portion of a top surface of the first insulating layer in a region around the first hole. The first electrode may be in contact with a top surface of the first insulating layer exposed by the second insulating layer.

According to some embodiments, the first electrode may be in direct contact with a sidewall of the second insulating layer and a sidewall of the active pattern defining the second hole.

According to some embodiments, a sidewall of the first insulating layer defining the first hole may have a positive taper shape.

According to some embodiments, an inclination angle of a sidewall of the first insulating layer defining the first hole may be an acute angle of 70° or less.

According to some embodiments, a sidewall of the first insulating layer defining the first hole may include a first sidewall positioned on the active pattern side and a second sidewall positioned on the second insulating layer side in cross-sectional view. An inclination angle of the first sidewall and an inclination angle of the second sidewall may be the same.

According to some embodiments, the first conductive layer may further include a second pattern spaced apart from the first pattern. The second conductive layer may further include a gate electrode overlapping the active pattern and spaced apart from the first electrode, and a second electrode spaced apart from the first electrode and the gate electrode and in contact with the active pattern. The second electrode may be in contact with the second pattern through a second contact hole. The second contact hole may include a third hole penetrating the first insulating layer and defined by a sidewall of the first insulating layer, and a fourth hole defined by a sidewall of the active pattern and a sidewall of the second insulating layer. A width of the fourth hole may be greater than a width of the third hole.

According to some embodiments, a sidewall of the active pattern defining the fourth hole may be on a top surface of the first insulating layer exposed by the active pattern in a region around the third hole. The top surface of the first insulating layer exposed by the active pattern may be between a sidewall of the first insulating layer defining the third hole and the sidewall of the active pattern defining the fourth hole in a plan view.

According to some embodiments, the active pattern may include a first region in contact with the first electrode, a second region in contact with the second electrode, and a third region between the first region and the second region. The second insulating layer may not be between the first region and the first electrode. The second insulating layer may not be between the second region and the second electrode.

According to some embodiments, the first hole may completely overlap the second hole in a plan view.

According to some embodiments, the first hole may not overlap the active pattern in a thickness direction of the substrate.

According to some embodiments, the first hole and the second hole may be spatially connected.

According to some embodiments of the present disclosure, there is provided a display device including a substrate, a first pattern on the substrate, a first insulating layer on the first pattern, an active pattern on the first insulating layer, a second insulating layer on the active pattern, and a first electrode on the second insulating layer and partially overlapping the first pattern and the active pattern, respectively. The first electrode is in contact with the first pattern through a first hole penetrating the first insulating layer and a second hole defined by the active pattern and the second insulating layer. The first hole is located inside the second hole in a plan view, and an edge of the first hole is not in contact with an edge of the second hole.

According to some embodiments, the second hole may be configured to expose a portion of a top surface of the first insulating layer in a region around the first hole.

According to some embodiments, the first electrode may be in contact with a top surface of the first insulating layer exposed by the second hole.

According to some embodiments, the first electrode may be in contact with a sidewall of the active pattern defining the second hole.

According to some embodiments, a sidewall of the active pattern defining the second hole may be on a top surface of the first insulating layer exposed by the active pattern in a region around the first hole. A top surface of the first insulating layer exposed by the active pattern may be between a sidewall of the first insulating layer defining the first hole and a sidewall of the active pattern defining the second hole in the plan view. A sidewall of the second insulating layer defining the second hole may be on a top surface of the first insulating layer exposed by the active pattern in a region around the first hole. A top surface of the first insulating layer exposed by the active pattern may be between a sidewall of the first insulating layer defining the first hole and a sidewall of the second insulating layer defining the second hole in the plan view.

According to some embodiments, a sidewall of the first insulating layer defining the first hole may have an acute angle of inclination.

According to some embodiments of the present disclosure, there is provided a method of fabricating a display device, including forming a first conductive layer including a first pattern on a substrate, forming a first insulating layer on the first conductive layer, forming a semiconductor layer including an active pattern on the first insulating layer, forming a second insulating layer on the semiconductor layer, and forming a contact hole penetrating the first insulating layer and the second insulating layer and exposing an end region of the active pattern and the first pattern. The forming of the contact hole includes forming a mask pattern on the second insulating layer, and etching the first insulating layer and the second insulating layer using the mask pattern. The mask pattern includes a first region having a first thickness and a second region having a second thickness smaller than the first thickness. The second region of the mask pattern overlaps an end region of the active pattern, and an end of the second region of the mask pattern protrudes more outward than an end of the active pattern.

According to some embodiments, the mask pattern is formed using a half-tone mask.

According to some embodiments, the etching of the first insulating layer and the second insulating layer may include forming a first opening penetrating the first insulating layer and the second insulating layer and exposing the first pattern. The first opening may be spaced apart from the active pattern in the plan view. The first opening may include a first hole defined by a sidewall of the first insulating layer and a second hole defined by a sidewall of the second insulating layer.

According to some embodiments, by etching the first insulating layer and the second insulating layer, in a region adjacent to the first opening, the second insulating layer may cover a top surface and a sidewall of the active pattern located in the end region of the active pattern.

According to some embodiments, the forming of the contact hole may further include, after etching the first insulating layer and the second insulating layer, removing the second region of the mask pattern.

According to some embodiments, the removing of the second region of the mask pattern may be performed by full surface etching in a state in which the mask pattern is formed.

According to some embodiments, by the full surface etching, a portion of the mask pattern overlapping a region around the first opening may expose a portion of the second insulating layer.

According to some embodiments, the forming of the contact hole further comprises etching the second insulating layer using the mask pattern from which the second region has been removed.

According to some embodiments, by etching the second insulating layer, the second insulating layer that is not covered by the mask pattern may be etched to expose a top surface of the first insulating layer in a region around the first hole and the end region of the active pattern.

According to the aforementioned and other embodiments of the present disclosure, the display device may include a substrate, a first conductive layer on the substrate, a first insulating layer on the first conductive layer, a semiconductor layer on the first insulating layer, a second insulating layer on the semiconductor layer, and a second conductive layer on the second insulating layer. An etching process of forming a contact hole interconnecting the second conductive layer and the first conductive layer may include a first etching process of forming a mask pattern using a halftone mask and then etching the first insulating layer and the second insulating layer using the mask pattern as an etching mask; a process of etching the entire surface of the mask pattern; and a second etching process of etching the second insulating layer using the remaining mask pattern as an etching mask. Meanwhile, because the mask pattern to be used in the first etching process is formed using the halftone mask, the remaining second insulating layer may cover an active pattern even after the first etching process is performed. Accordingly, because the second insulating layer exposed by the mask pattern in the second etching process has the same thickness in the entire surface thereof, the active pattern is prevented from being exposed by the second insulating layer even in the region around the contact hole. Thus, damage to the active pattern can be prevented.

According to the aforementioned and other embodiments of the present disclosure, as a first hole formed in the first etching process is designed to be spaced apart from the semiconductor layer located thereon, the sidewall of the first insulating layer defining the first hole has an acute angle of, for example (or in some embodiments, preferably), 70° or less. Accordingly, formation of a seam in a third insulating layer to be formed on the second conductive layer in a subsequent process may be prevented, so that reliability of the fabricating process of the display device can be improved, and, thus, the quality of the display device can also be improved.

BRIEF DESCRIPTION OF THE DRAWINGS

The above and other embodiments and features of embodiments according to the present disclosure will become more apparent by describing aspects of some embodiments thereof with reference to the attached drawings, in which.

DETAILED DESCRIPTION

Figure 1:
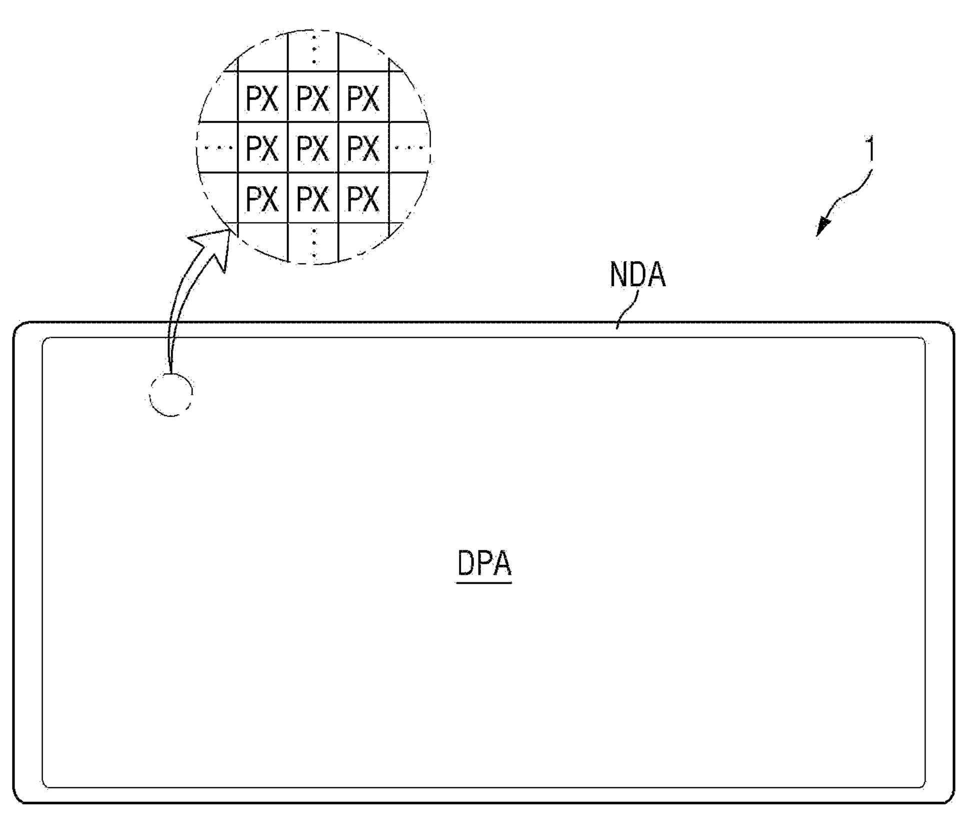
FIG. 1 is a schematic plan view of a display device according to some embodiments.
Figure 1:
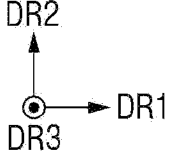

Aspects of some embodiments of the present disclosure and methods of accomplishing the same may be understood more readily by reference to the detailed description of embodiments and the accompanying drawings. Hereinafter, aspects of some embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of some embodiments of the present disclosure might not be described.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of embodiments according to the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as “beneath,” “below,” “lower,” “under,” “above,” “upper,” and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of some embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a display device according to some embodiments.

Referring to FIG. 1, a display device 1 displays a moving image or a still image. The display device 1 may refer to any electronic device providing a display screen. Examples of the display device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 1 includes a display panel which provides a display screen. Examples of the display panel may include an inorganic light emitting diode display panel, an organic light emitting display panel, a quantum dot light emitting display panel, a plasma display panel and a field emission display panel. In the following, an embodiment in which an organic light emitting display panel is applied as the display panel will be illustrated, but embodiments according to the present disclosure is not limited thereto, and other display panels may be applied within the same scope of technical spirit.

Hereinafter, a first direction DR1, a second direction DR2, and a third direction DR3 are defined in drawings of embodiments describing the display device 1. The first direction DR1 and the second direction DR2 may be directions perpendicular to each other in one plane. The third direction DR3 may be a direction perpendicular to a plane on which the first direction DR1 and the second direction DR2 are located. The third direction DR3 is perpendicular to each of the first direction DR1 and the second direction DR2. In the embodiments describing the display device 1, the third direction DR3 indicates a thickness direction (or display direction) of the display device 1.

The display device 1 may have a rectangular shape including long and short sides such that the side in the first direction DR1 is longer than the side in the second direction DR2 in a plan view. A corner portion where the long side and the short side of the display device 1 meet may have a right angle in a plan view. However, embodiments according to the present invention are not limited thereto, and the corner portion may be rounded to have a curved shape. The shape of the display device 1 is not limited to the illustrated one and may be variously modified. For example, the display device 1 may have other shapes such as a square shape, a quadrilateral shape with rounded corners (vertices), other polygonal shapes and a circular shape in a plan view.

A display surface of the display device 1 may be arranged on one side of the third direction DR3 which is the thickness direction. In embodiments describing the display device 1, unless otherwise noted, the term "upward" refers to one side of the third direction DR3, which is the display direction, and the term "top surface" refers to a surface toward the one side of the third direction DR3. Further, the term "downward" refers to the other side of the third direction DR3, which is an opposite direction to the display direction, and the term "bottom surface" refers to a surface toward the other side of the third direction DR3. Furthermore, "left", "right", "upper" and "lower" indicate directions when the display device 1 is viewed from above. For example, "right side" indicates one side of the first direction DR1, "left side" indicates the other side of the first direction DR1, "upper side" indicates one side of the second direction DR2, and "lower side" indicates the other side of the second direction DR2.

The display device 1 may include a display area DPA and a non-display area NDA. The display area DPA is an area where a screen can be displayed, and the non-display area NDA is an area where a screen is not displayed.

The shape of the display area DPA may follow the shape of the display device 1. For example, the shape of the display area DPA may have a rectangular shape similar to the overall shape of the display device 1 in a plan view. The display area DPA may substantially occupy the center of the display device 1.

The display area DPA may include a plurality of pixels PX. The plurality of pixels PX may be arranged, for example, in a matrix configuration. The shape of each pixel PX may be a rectangular or square shape in a plan view, although embodiments according to the present disclosure are not limited thereto, and the pixels PX may be arranged in any suitable configuration. According to some embodiments, each pixel PX may include a plurality of light emitting elements made of inorganic particles.

The non-display area NDA may be arranged around the display area DPA. The non-display area NDA may completely or partially surround the display area DPA. The non-display area NDA may form a bezel of the display device 1.

Figure 2:
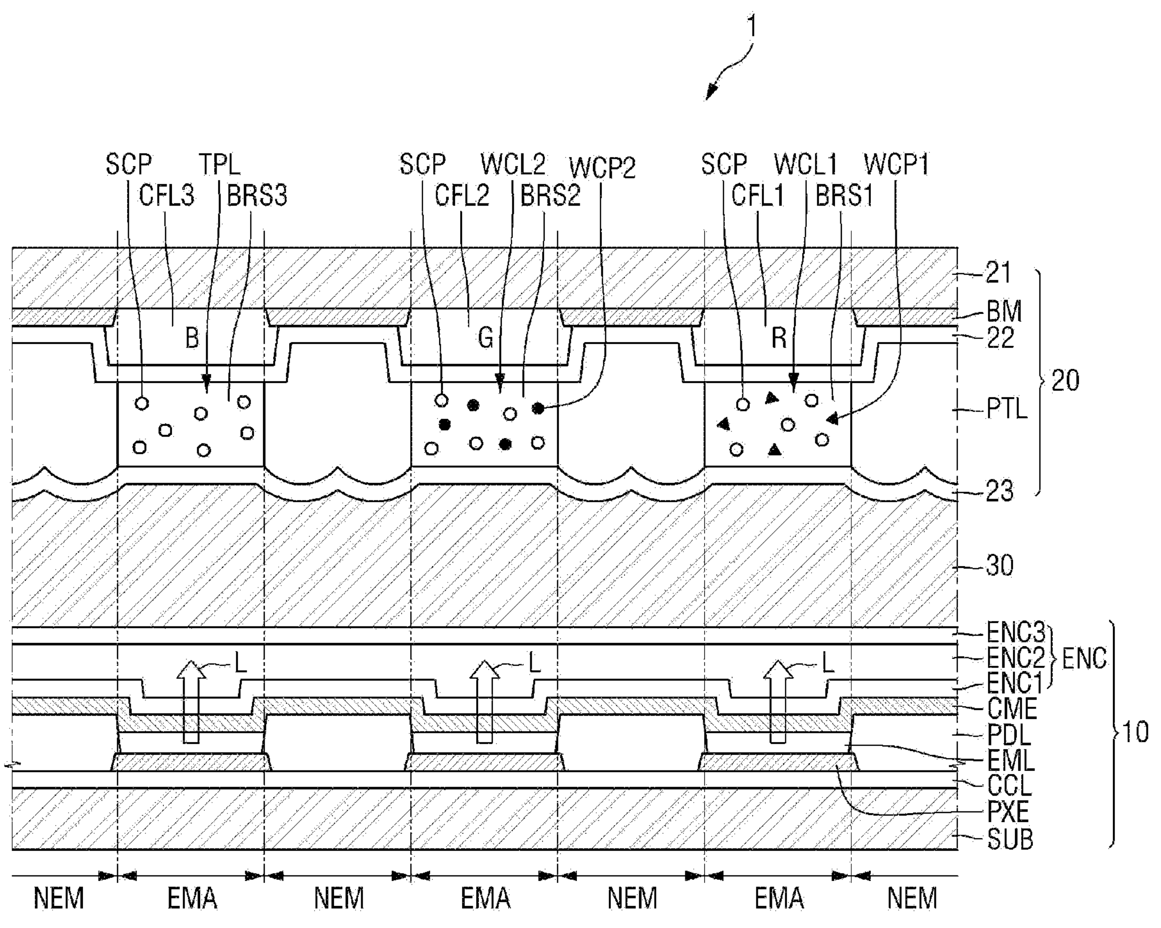
FIG. 2 is a cross-sectional view of a display device according to some embodiments.
Figure 2:
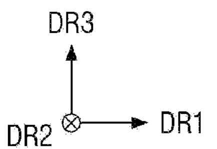

FIG. 2 is a cross-sectional view of a display device according to some embodiments.

FIG. 2 illustrates, as an example, a top emission type display device in which light L is not emitted in the direction toward a first substrate SUB on which an emission layer EML is formed, but is emitted in the opposite direction (toward a second substrate 21). However, the display device 1 is not limited thereto.

Referring to FIG. 2, the display device 1 may include the emission layer EML, an encapsulation layer ENC covering the emission layer EML, a wavelength control layer CW arranged on the encapsulation layer ENC, and a color filter layer CFL arranged on the upper portion. According to some embodiments, the display device 1 may include a first display substrate 10 and a second display substrate 20 facing each other. The emission layer EML, the encapsulation layer ENC, the wavelength control layer CW, and the color filter layer CFL mentioned above may belong to either one of the first display substrate 10 and the second display substrate 20. However, embodiments according to the present disclosure are not limited thereto, and in the display device 1 according to some embodiments, the second display substrate 20 may be omitted, and the emission layer EML, the encapsulation layer ENC, the wavelength control layer CW, and the color filter layer CFL may be included in one display substrate and sequentially arranged on the first substrate SUB.

For example, the first display substrate 10 may include the first substrate SUB, the emission layer EML arranged on one surface of the first substrate SUB, and the encapsulation layer ENC located on the emission layer EML. Further, the second display substrate 20 may include the second substrate 21, and the wavelength control layer CW and the color filter layer CFL located on one surface of the second substrate 21 facing the first substrate SUB. The wavelength control layer CW may include a wavelength conversion layer WCL and a light transmission layer TPL.

The filling layer 30 may be located between the encapsulation layer ENC and the wavelength control layer CW. The filling layer 30 may fill a space between the first display substrate 10 and the second display substrate 20 while bonding them to each other.

The first substrate SUB of the first display substrate 10 may be an insulating substrate. The first substrate SUB may include a transparent material. For example, the first substrate SUB may include a transparent insulating material such as glass, quartz, or the like. The first substrate SUB may be a rigid substrate. However, the first substrate SUB is not limited to the illustrated substrate. The first substrate SUB may include plastic such as polyimide or the like, and may have a flexible property so that it can be curved, bent, folded, or rolled.

A plurality of pixel electrodes PXE may be located on one surface of the first substrate SUB. Each pixel electrode PXE may be arranged for each pixel PX. The pixel electrodes PXE of the neighboring pixels PX may be separated from each other. A circuit layer CCL for driving the pixels PX may be located on the first substrate SUB. The circuit layer CCL may be provided between the first substrate SUB and the pixel electrodes PXE. Further detailed description of the circuit layer CCL will be made later.

The pixel electrode PXE may be a first electrode (e.g., an anode electrode) of a light emitting diode. The pixel electrode PXE may have a stacked structure formed by stacking a material layer having a high work function, such as indium tin oxide (ITO), indium zinc oxide (IZO), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof. The material layer having a high work function may be located above the reflective material layer and arranged closer to a light emitting layer EML. The pixel electrode PXE may have a multilayer structure of ITO/Mg, ITO/MgF, ITO/Ag or ITO/Ag/ITO, but embodiments according to the present disclosure are not limited thereto.

A pixel defining layer PDL may be located on one surface of the first substrate SUB along the boundaries of the pixels PX. The pixel defining layer PDL may be located on the pixel electrode PXE and may include an opening to expose the pixel electrode PXE. Emission areas EMA and non-emission areas NEM may be distinguished by the pixel defining layer PDL and the openings of the pixel defining layer PDL. The pixel defining layer PDL may include an organic insulating material such as acrylic resin, epoxy resin, phenolic resin, polyamide resin, polyimide resin, unsaturated polyester resin, polyphenylene resin, polyphenylenesulfide resin or benzocyclobutene (BCB). The pixel defining layer PDL may include an inorganic material.

The light emitting layer EML is located on the pixel electrodes PXE exposed by the pixel defining layer PDL. In embodiments in which the display device 1 is an organic light emitting display, the light emitting layers EML may include an organic layer having an organic material. The organic layer may include an organic light emitting layer, and in some cases, may further include a hole injection/transport layer and/or an electron injection/transport layer, as an auxiliary layer for assisting light emission. According to some embodiments, when the display device 1 is an LED display or the like, the light emitting layer EML may include an inorganic material such as an inorganic semiconductor.

In some embodiments, the light emitting layers EML may have a tandem structure in which a plurality of organic light emitting layers are superposed in the thickness direction and a charge generation layer is located between the organic light emitting layers. The respective organic light emitting layers superposed may emit light of the same wavelength, or may emit light of different wavelengths. At least a portion of the light emitting layer EML of each pixel PX may be separated from the same layer of the neighboring pixel PX.

According to some embodiments, the wavelengths of light emitted from the respective light emitting layers EML may be the same regardless of the color pixels PX. For example, the light emitting layer EML of each color pixel PX may emit blue light or ultraviolet rays, and the wavelength control layer CW may include a wavelength conversion layer WCL, thereby displaying a color for each pixel PX.

According to some embodiments, the wavelength of light emitted from each light emitting layer EML may be different for each color pixel PX. For example, the light emitting layer EML of the first color pixel PX may emit light of a first color, the light emitting layer EML of the second color pixel PX may emit light of a second color, and the light emitting layer EML of the third color pixel PX may emit light of a third color.

The common electrode CME may be arranged on the light emitting layer EML. The common electrode CME may be in contact with the light emitting layers EML as well as the top surface of the pixel defining layer PDL.

The common electrode CME may be continuous across the pixels PX. The common electrode CME may be a full surface electrode arranged over the entire surface across all the pixels PX. The common electrode CME may be a second electrode (e.g., a cathode electrode) of a light emitting diode.

The common electrode CME may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg). The common electrode CME may further include a transparent metal oxide layer arranged on the material layer having a low work function.

The pixel electrode PXE, the light emitting layer EML, and the common electrode CME may constitute a light emitting element (e.g., an OLED). Light emitted from the light emitting layer EML may be emitted upward through the common electrode CME.

The encapsulation layer ENC may be arranged on the common electrode CME. The encapsulation layer ENC may include at least one encapsulation layer. For example, the encapsulation layer may include a first inorganic film ENC1, an organic film ENC2, and a second inorganic film ENC3. Each of the first inorganic film ENC1 and the second inorganic film ENC3 may include silicon nitride, silicon oxide, silicon oxynitride, or the like. The organic film ENC2 may include an organic insulating material such as acrylic resin, epoxy resin, phenolic resin, polyamide resin, polyimide resin, unsaturated polyester resin, polyphenylene resin, polyphenylenesulfide resin or benzocyclobutene (BCB).

The second display substrate 20 may be arranged on the encapsulation layer ENC to face it. The second substrate 21 of the second display substrate 20 may include a transparent material. The second substrate 21 may include a transparent insulating material such as glass, quartz, or the like. The second substrate 21 may be a rigid substrate. However, the second substrate 21 is not limited to the illustrated substrate. The second substrate 21 may include plastic such as polyimide or the like, and may have a flexible property so that it can be curved, bent, folded, or rolled.

The second substrate 21 may be the same substrate as the first substrate SUB, but may have a different material, thickness, transmittance and the like. For example, the second substrate 21 may have a higher transmittance than the first substrate SUB. The second substrate 21 may be thicker or thinner than the first substrate SUB.

A light blocking member BM may be arranged on one surface of the second substrate 21 facing the first substrate SUB along the boundaries of the pixels PX. The light blocking member BM may overlap the pixel defining layer PDL of the first display substrate 10 and may be positioned in the non-emission areas NEM. The light blocking member BM may include openings to expose the surface of the second substrate 21 overlapping the emission areas EMA. The light blocking member BM may be formed in a grid shape in a plan view.

The light blocking member BM may include an organic material. The light blocking member BM may reduce color distortion due to external light reflection by absorbing the external light. Further, the light blocking member BM may serve to prevent light which is emitted from the light emitting layer EML from entering the adjacent pixels PX.

According to some embodiments, the light blocking member BM may absorb all visible wavelengths. The light blocking member BM may include a light absorbing material. For example, the light blocking member BM may be formed of a material used as a black matrix of the display device 1.

The color filter layers CFL may be arranged on the surface of the second substrate 21 on which the light blocking member BM is arranged. The color filter layers CFL may be provided on the surface of the second substrate 21, which is exposed through the openings of the light blocking member BM. Further, each color filter layer CFL may be partially arranged on the adjacent light blocking member BM.

The color filter layer CFL may include a first color filter layer CFL1 arranged in the first color pixel PX, a second color filter layer CFL2 arranged in the second color pixel PX and a third color filter layer CFL3 arranged in the third color pixel PX. Each of the color filter layers CFL may include a colorant such as a dye or a pigment that absorbs wavelengths other than the corresponding color wavelength. The first color filter layer CFL1 may be a red color filter layer, the second color filter layer CFL2 may be a green color filter layer, and the third color filter layer CFL3 may be a blue color filter layer. In the drawing, neighboring color filter layers CFL are arranged to be spaced apart from each other on the light blocking member BM, but the neighboring color filter layers CFL may partially overlap each other on the light blocking member BM.

A first capping layer 22 may be arranged on the color filter layers CFL. The first capping layer 22 may prevent impurities such as moisture or air from permeating from the outside and damaging or contaminating the color filter layers CFL. Further, the first capping layer 22 may prevent or reduce instances of the colorants of the color filter layers CFL being diffused into other members.

The first capping layer 22 may be in direct contact with one surface (bottom surface in FIG. 2) of the color filter layer CFL. The first capping layer 22 may be made of an inorganic material. For example, the first capping layer 22 may include silicon nitride, aluminum nitride, zirconium nitride, titanium nitride, hafnium nitride, tantalum nitride, silicon oxide, aluminum oxide, titanium oxide, tin oxide, silicon oxynitride, or the like.

A partition wall PTL may be arranged on the first capping layer 22. The partition wall PTL may be arranged in the non-emission area NEM. The partition wall PTL may be arranged to overlap the light blocking member BM. The partition wall PTL may include openings exposing the color filter layers CFL. The partition wall PTL may include a photosensitive organic material, but embodiments according to the present disclosure are not limited thereto. The partition wall PTL may further include a light blocking material.

The wavelength control layer CW may be arranged in a space exposed by the opening of the partition wall PTL. The wavelength control layer CW may be formed by an inkjet process using the partition wall PTL as a bank, but embodiments according to the present disclosure are not limited thereto.

In embodiments in which the light emitting layer EML of each pixel PX emits light in a third color, the wavelength conversion layer WCL may include a first wavelength conversion pattern WCL1 arranged in the first color pixel PX and a second wavelength conversion pattern WCL2 arranged in the second color pixel PX. The light transmitting layer TPL may be arranged in the third color pixel PX.

The first wavelength conversion pattern WCL1 may include a first base resin BRS1 and a first wavelength conversion material WCP1 provided in the first base resin BRS1. The second wavelength conversion pattern WCL2 may include a second base resin BRS2 and a second wavelength conversion material WCP2 provided in the second base resin BRS2. The light transmitting layer TPL may include a third base resin BRS3 and scatterers SCP provided in the third base resin BRS3.

The first to third base resins BRS1, BRS2, and BRS3 may include a light transmitting organic material. For example, the first to third base resins BRS1, BRS2, and BRS3 may include an epoxy resin, an acrylic resin, a cardo resin, an imide resin, or the like. The first to third base resins BRS1, BRS2, and BRS3 may be formed of the same material, but the present disclosure is not limited thereto.

The scatterers SCP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like.

The first wavelength conversion material WCP1 may convert the third color into the first color, and the second wavelength conversion material WCP2 may convert the third color into the second color. The first wavelength conversion material WCP1 and the second wavelength conversion material WCP2 may be quantum dots, quantum bars, phosphors or the like. Examples of the quantum dot may include group IV nanocrystal, group II-VI compound nanocrystal, group III-V compound nanocrystal, group IV-VI nanocrystal, and a combination thereof. The first wavelength conversion pattern WCL1 and the second wavelength conversion pattern WCL2 may further include scatterers SCP for increasing wavelength conversion efficiency.

The light transmitting layer TPL arranged in the third color pixel PX transmits light of the third color emitted from the light emitting layer EML while maintaining the wavelength of the light. The scatterers SCP of the light transmitting layer TPL may serve to control an emission path of the light emitted through the light transmitting layer TPL. The light transmitting layer TPL may not include a wavelength conversion material.

A second capping layer 23 is arranged on the wavelength conversion layer WCL and the light transmitting layer TPL. The second capping layer 23 may be formed of an inorganic material. The second capping layer 23 may include a material selected from the above-mentioned materials of the first capping layer 22. The first capping layer 22 and the second capping layer 23 may be formed of the same material, but embodiments according to the present disclosure are not limited thereto.

The filling layer 30 may be arranged between the first display substrate 10 and the second display substrate 20. The filling layer 30 may fill a space between the first display substrate 10 and the second display substrate 20, and may serve to bond them to each other. The filling layer 30 may be arranged between the encapsulation layer ENC of the first display substrate 10 and the second capping layer 23 of the second display substrate 20. The filling layer 30 may be formed of an Si-based organic material, an epoxy-based organic material, or the like, but is not limited thereto.

Figure 3:
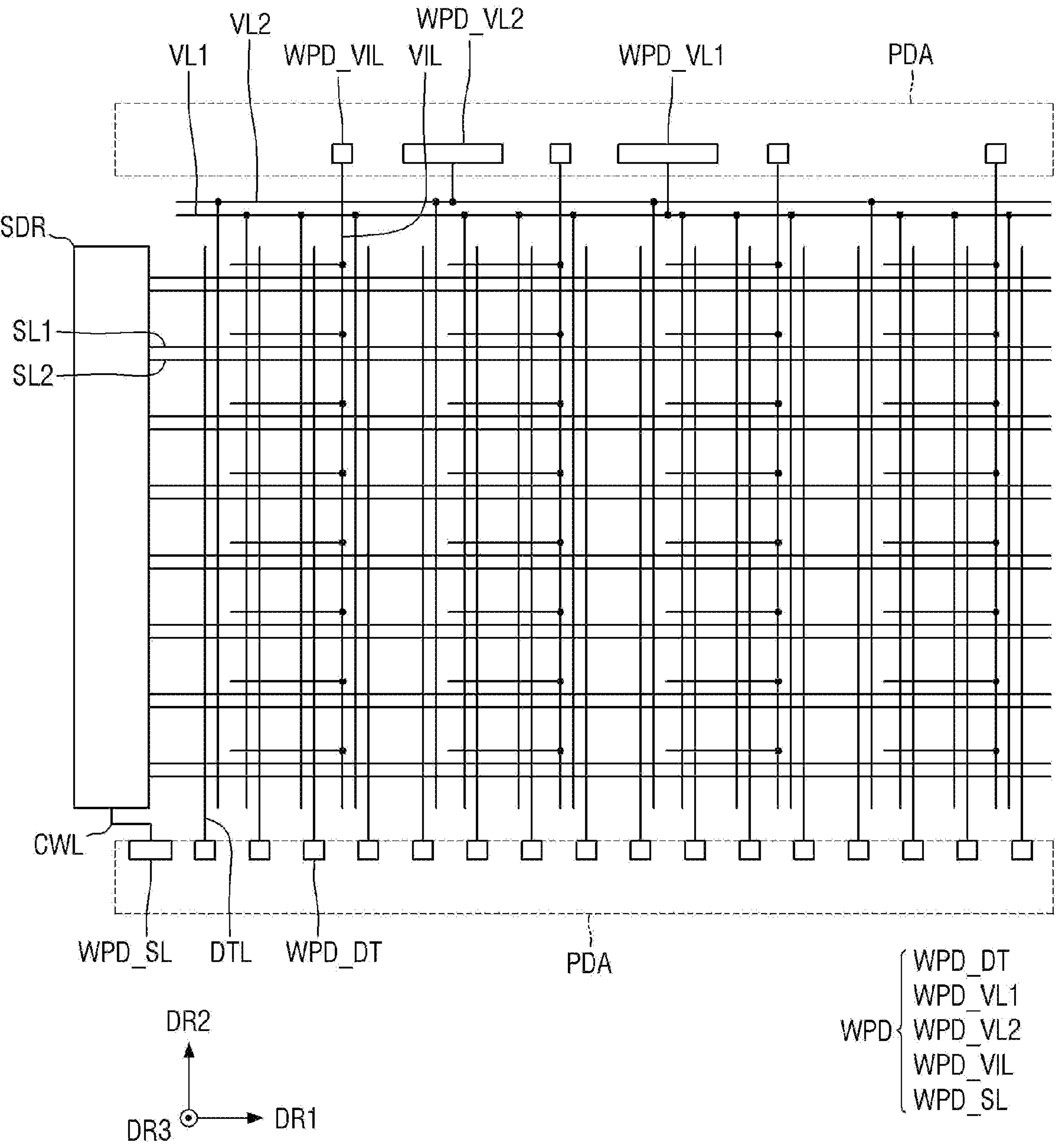
FIG. 3 is a schematic layout diagram showing wires included in a display device according to some embodiments.

FIG. 3 is a schematic layout diagram showing wires included in a display device according to some embodiments.

Referring to FIG. 3, a plurality of wires may be arranged on the first substrate SUB of the first display substrate 10. The plurality of wires may be included in the circuit layer CCL of the above-described first display substrate 10. The plurality of wires may include a first scan line SL1, a second scan line SL2, a data line DTL, a reference voltage line VIL, a first voltage line VL1, a second voltage line VL2, and the like. According to some embodiments, other wires may be further provided in the display device 1.

Meanwhile, the term "connected" as used herein may mean not only that one member is connected to another member through a physical contact, but also that one member is connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

The first scan line SL1 and the second scan line SL2 may extend in the first direction DR1. The first scan line SL1 and the second scan line SL2 may be connected to a scan driver SDR. The scan driver SDR may include a driving circuit formed of the circuit layer CCL. The scan driver SDR may be arranged in the non-display area NDA. According to some embodiments, the scan driver SDR may be arranged in the non-display area NDA positioned adjacent to the first short side (left side in FIG. 1) of the display device 1, but embodiments according to the present disclosure are not limited thereto. Instead, the scan driver SDR may be arranged in the non-display area NDA positioned adjacent to the second short side (right side in FIG. 1) of the display device 1. The scan driver SDR may be connected to a signal connection line CWL, and at least one end of the signal connection line CWL forms a wire pad WPD_SL (hereinafter, referred to as 'signal connection pad') on the non-display area NDA to be connected to an external device.

The data line DTL and the reference voltage line VIL may extend in a second direction DR2 crossing the first direction DR1. The reference voltage line VIL may further include, in addition to a portion extending in the second direction DR2, a portion branched in the first direction DR1 therefrom.

The first voltage line VL1 and the second voltage line VL2 may extend in the second direction DR2. The first voltage line VL1 and the second voltage line VL2 may further include a portion extending in the first direction DR1. The first voltage line VL1 and the second voltage line VL2 may have a mesh structure, but are not limited thereto.

A wire pad WPD may be located at at least one end of each of the data line DTL, the reference voltage line VIL, the first voltage line VL1, and the second voltage line VL2. The wire pads WPD may be located in pad areas PDA included in the non-display area NDA. The pad areas PDA may be located in the non-display area NDA adjacent to the first long side (upper side in FIG. 1) of the display device 1 and in the non-display area NDA adjacent to the second long side (lower side in FIG. 1) of the display device 1.

According to some embodiments, a wire pad WPD_DT (hereinafter, referred to as 'data pad') of the data line DTL may be located in the pad area PDA on the lower side, and a wire pad WPD_VIL (hereinafter, referred to as 'reference voltage pad') of the reference voltage line VIL, a wire pad WPD_VL1 (hereinafter, referred to as 'first power pad') of the first voltage line VL1 and a wire pad WPD_VL2 (hereinafter, referred to as 'second power pad') of the second voltage line VL2 may be located in the pad area PDA on the upper side. As another example, the data pad WPD_DT, the reference voltage pad WPD_VIL, the first power pad WPD_VL1, and the second power pad WPD_VL2 may be all located in the same area, for example, in the pad area PDA on the upper side. The external devices may be mounted on the wire pads WPD. The external devices may be mounted on the wire pads WPD by applying an anisotropic conductive film, ultrasonic bonding or the like.

Each pixel PX on the first substrate SUB includes a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. Hereinafter, the pixel driving circuit will be described in conjunction with a 3T1C structure including three transistors and one capacitor as an example. However, the present disclosure is not limited thereto, and other modified pixel PX structures such as a 2T1C structure, a 7T1C structure, and a 6T1C structure may be adopted.

Figure 4:
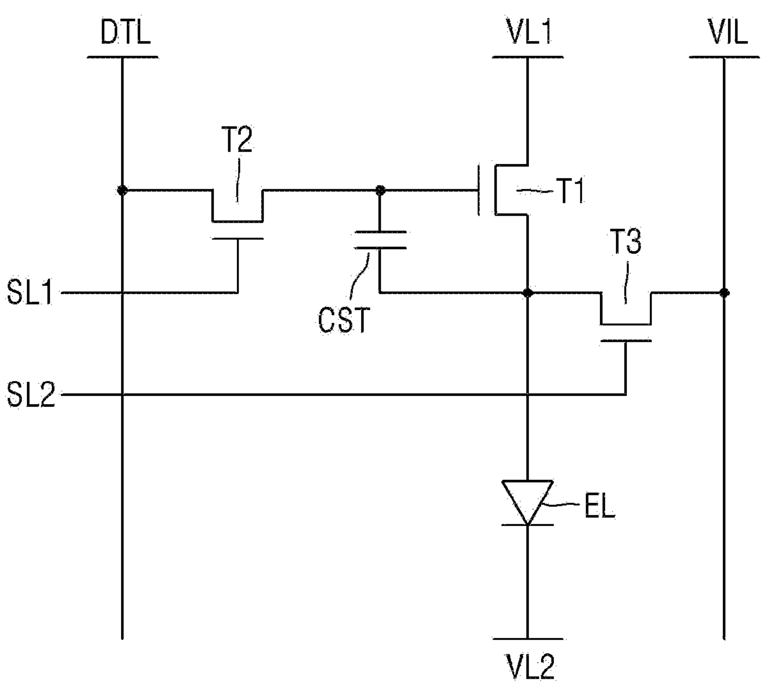
FIG. 4 is an equivalent circuit diagram of one pixel of a display device according to some embodiments.

FIG. 4 is an equivalent circuit diagram of one pixel of a display device according to some embodiments.

Referring to FIG. 4, each pixel PX of the display device 1 according to some embodiments may include a light emitting element EL, a plurality of transistors T1, T2 and T3, and one storage capacitor CST. The plurality of transistors T1, T2, and T3 may include a first transistor T1, a second transistor T2, and a third transistor T3.

The light emitting element EL emits light according to a current supplied through the first transistor T1. The light emitting element EL may be implemented as an OLED, a micro light emitting diode, a nano light emitting diode or the like. The light emitting element EL includes a first electrode, a second electrode, and at least one light emitting element located between them. The light emitting element may emit light of a specific wavelength band by electrical signals transmitted from the first electrode and the second electrode.

One end of the light emitting element EL may be connected to the source electrode of the first transistor T1, and the other end thereof may be connected to the second voltage line VL2 to which a low potential voltage (hereinafter, a second power voltage) lower than a high potential voltage (hereinafter, a first power voltage) of the first voltage line VL1 is supplied.

The first transistor T1 adjusts a current flowing from the first voltage line VL1, to which the first power voltage is supplied, to the light emitting element EL according to the voltage difference between the gate electrode and the source electrode. For example, the first transistor T1 may be a driving transistor for driving the light emitting element EL. The gate electrode of the first transistor T1 may be connected to the second source/drain electrode of the second transistor T2, the source electrode of the first transistor T1 may be connected to the first electrode of the light emitting element EL, and the drain electrode of the first transistor T1 may be connected to the first voltage line VL1 to which the first power voltage is applied.

The second transistor T2 is turned on by a first scan signal of the first scan line SL1 to connect the data line DTL to the gate electrode of the first transistor T1. The gate electrode of the second transistor T2 may be connected to the first scan line SL1, the second source/drain electrode of the second transistor T2 may be connected to the gate electrode of the first transistor T1, and the first source/drain electrode of the second transistor T2 may be connected to the data line DTL.

The third transistor T3 is turned on by a second scan signal of the second scan line SL2 to connect the reference voltage line VIL to the source electrode of the first transistor T1. The gate electrode of the third transistor T3 may be connected to the second scan line SL2, the first source/drain electrode of the third transistor T3 may be connected to the reference voltage line VIL, and the second source/drain electrode of the third transistor T3 may be connected to the source electrode of the first transistor T1.

According to some embodiments, the first source/drain electrode and the second source/drain electrode of each of the second and third transistors T2 and T3 may be the source electrode and the drain electrode, respectively. However, the present disclosure is not limited thereto, and the first source/drain electrode and the second source/drain electrode thereof may be the drain electrode and the source electrode, respectively.

The capacitor CST is formed between the gate electrode of the first transistor T1 and the source electrode of the first transistor T1. The capacitor CST stores the difference voltage between the gate voltage and the source voltage of the first transistor T1.

Each of the first to third transistors T1, T2, and T3 may be formed as a thin film transistor. Although FIG. 4 mainly describes the case where the first to third transistors T1, T2, and T3 are formed as an N-type metal oxide semiconductor field effect transistor (MOSFET), embodiments according to the present disclosure are not limited thereto. That is, the first to third transistors T1, T2, and T3 may be formed as a P-type MOSFET, or at least one of the first to third transistors T1, T2, or T3 may be formed as the N-type MOSFET, and the rest of the first to third transistors T1, T2, or T3 may be formed as the P-type MOSFET.

Figure 5:
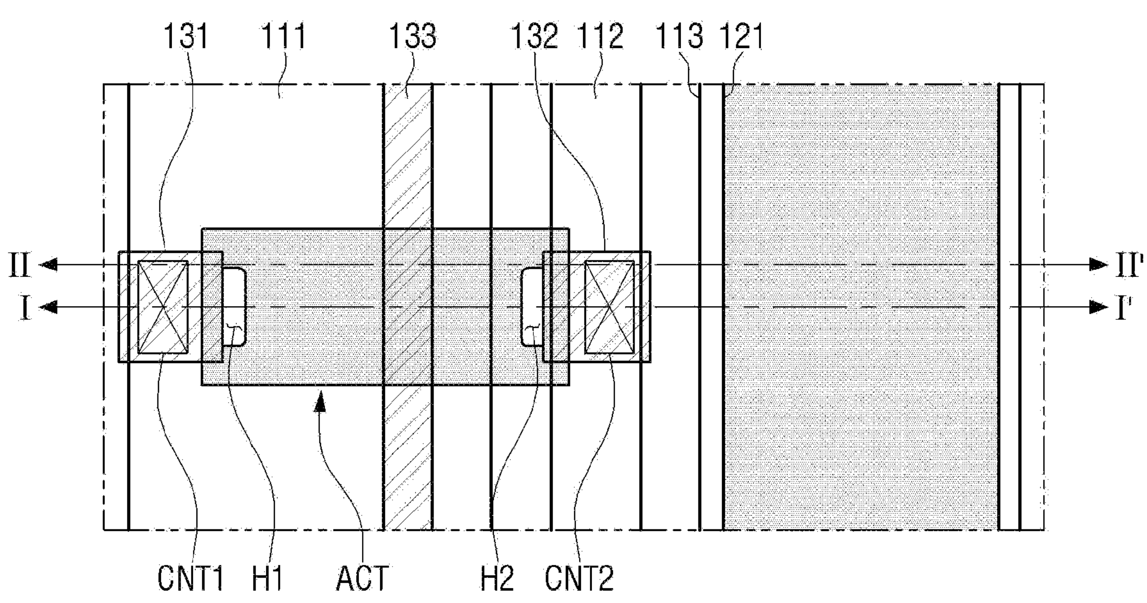
FIG. 5 is a plan layout view of a transistor included in a display device according to some embodiments.
Figure 5:
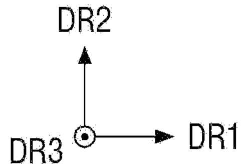
Figure 6:
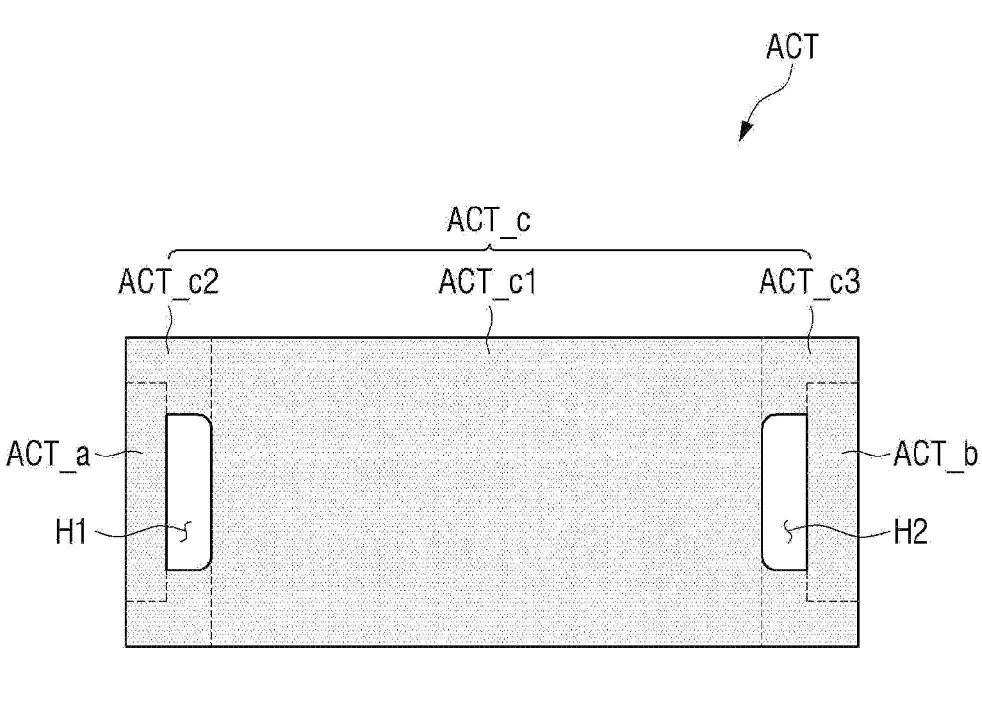
FIG. 6 is a plan view of an active pattern included in the transistor of FIG. 5 according to some embodiments.
Figure 7:
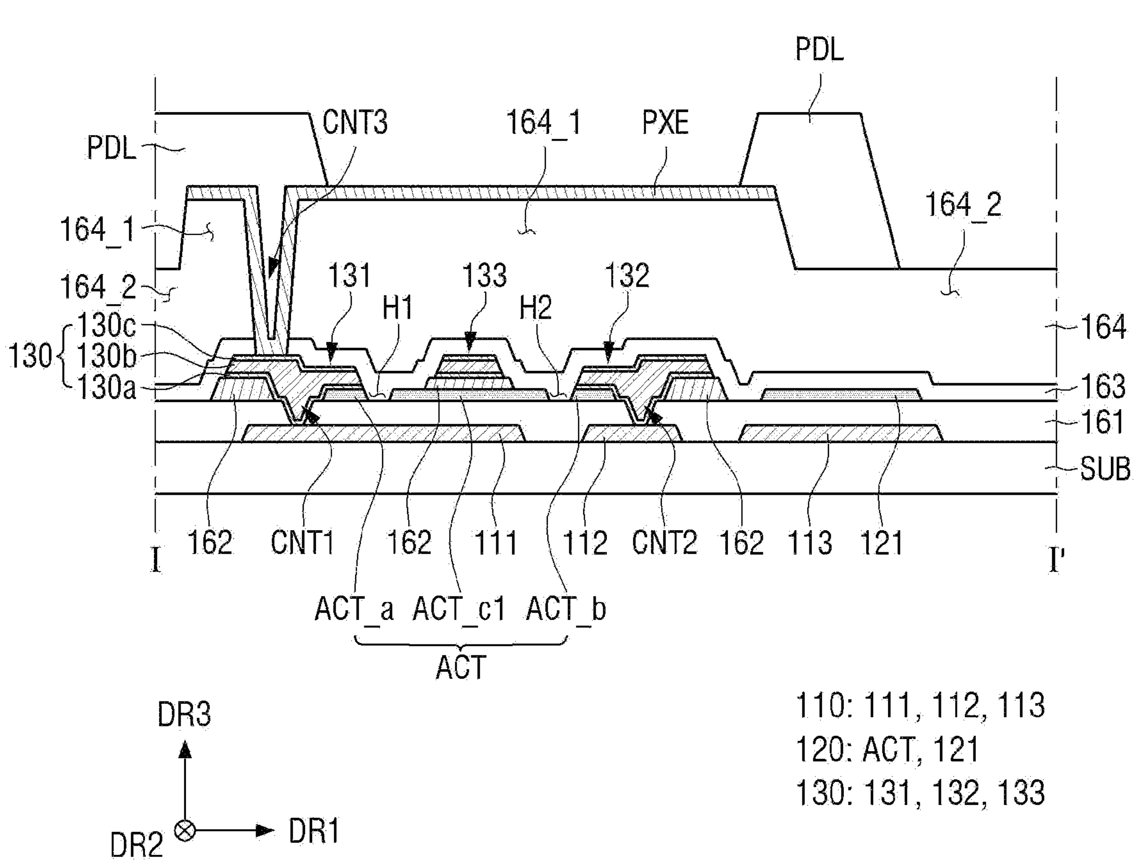
FIG. 7 is a cross-sectional view illustrating an example of a display device taken along the line I-I' of FIG. 5 according to some embodiments.
Figure 8:
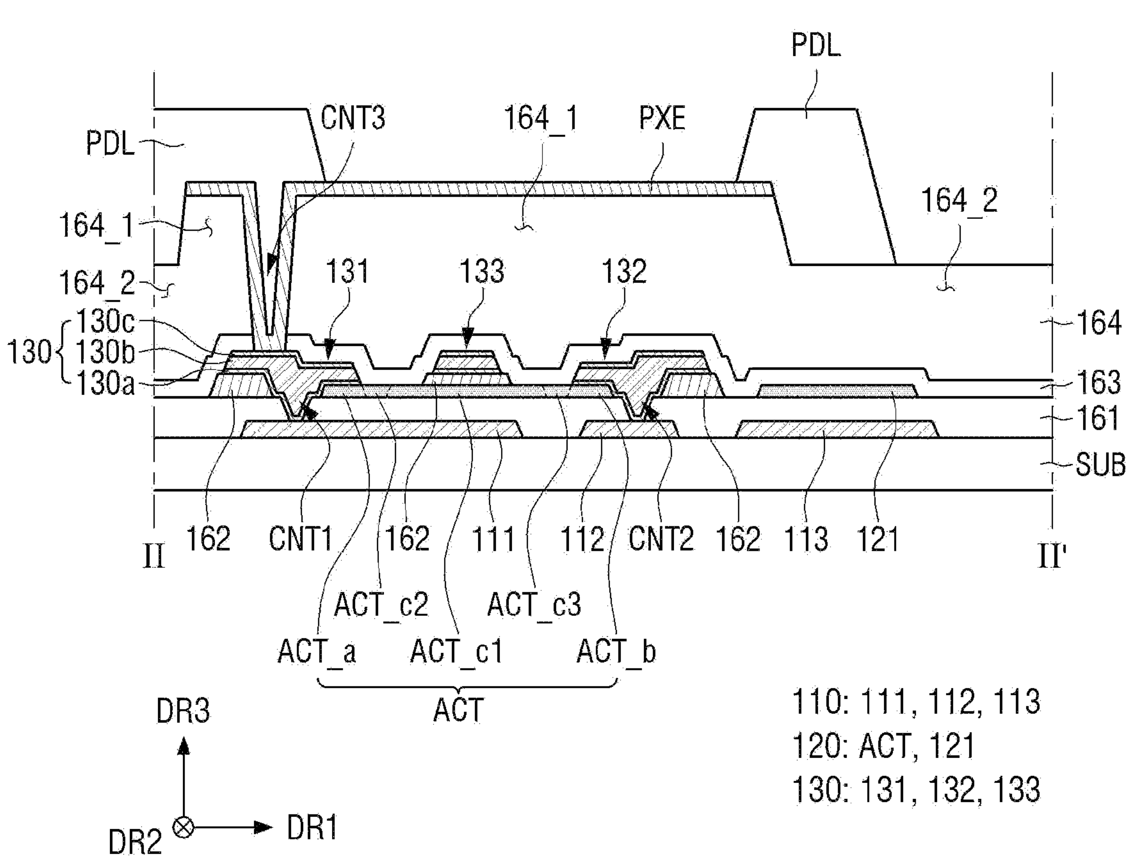
FIG. 8 is a cross-sectional view of the display device taken along the line II-II' of FIG. 5 according to some embodiments.

FIG. 5 is a plan layout view of a transistor included in a display device according to some embodiments. FIG. 6 is a plan view of an active pattern included in the transistor of FIG. 5. FIG. 7 is a cross-sectional view illustrating an example of a display device taken along the line I-I' of FIG. 5. FIG. 8 is a cross-sectional view of the display device taken along the line II-II' of FIG. 5.

The description on the transistor included in the circuit layer CCL to be described later will be provided for the first transistor T1. However, without being limited thereto, the following description may be applicable to the second and third transistors T2 and T3 as well.

Referring to FIGS. 5 to 8, the circuit layer CCL includes a semiconductor layer 120, a plurality of conductive layers, and a plurality of insulating layers arranged on the first substrate SUB. For example, the circuit layer CCL included in the display device 1 may include the first substrate SUB, a first conductive layer 110 arranged on the first substrate SUB, a first insulating layer 161 arranged on the first conductive layer 110, the semiconductor layer 120 arranged on the first insulating layer 161, a second insulating layer 162 arranged on the semiconductor layer 120, a second conductive layer 130 arranged on the second insulating layer 162, a third insulating layer 163 arranged on the second conductive layer 130, a via layer arranged on the third insulating layer 163, and the pixel electrode PXE arranged on the via layer 164. The display device 1 may further include the pixel defining layer PDL arranged on the pixel electrode PXE.

The first substrate SUB may support the respective layers arranged thereon. The first substrate SUB may be an insulating substrate. For example, the first substrate SUB may be made of such a material as polymer resin or glass.

Hereinafter, the relative arrangement of the first conductive layer 110, the semiconductor layer 120, and the second conductive layer 130 arranged on the first substrate SUB in a plan view will be described with reference to FIGS. 5 and 6.

The first conductive layer 110 may include a first pattern 111, a second pattern 112, and a first capacitor pattern 113.

The first pattern 111 may overlap a portion of the active pattern ACT. The first pattern 111 may be electrically connected to the first source/drain electrode 131 of the second conductive layer 130 through a first contact hole CNT1. The first pattern 111 may be connected to the first source/drain electrode 131 to suppress fluctuation of the voltage of the first transistor T1.

The second pattern 112 may be arranged to be spaced apart from the first pattern 111. The second pattern 112 may be arranged on one side of the first pattern 111 in the first direction DR1. The second pattern 112 may have a shape extending in the second direction DR2 in a plan view. The second pattern 112 may overlap a portion of the active pattern ACT that does not overlap the first pattern 111.

The second pattern 112 may be electrically connected to the second source/drain electrode 132 of the second conductive layer 130 through a second contact hole CNT2. An electrical signal may be applied to the second pattern 112. The electrical signal applied to the second pattern 112 may be transmitted to the second source/drain electrode 132 through the second contact hole CNT2. When FIG. 5 illustrates the first transistor T1, the second pattern 112 may be the first voltage line VL1.

The first capacitor pattern 113 may be arranged to be spaced apart from the first pattern 111 and the second pattern 112. For example, the first capacitor pattern 113 may be spaced apart from the first pattern 111 and the second pattern 112 in the first direction DR1 with the second pattern 112 located between the first capacitor pattern 113 and the first pattern 111.

The first capacitor pattern 113 may overlap a second capacitor pattern 121. The first capacitor pattern 113 and the second capacitor pattern 121 of the semiconductor layer 120 to be described later may constitute the storage capacitor CST together. That is, the first capacitor pattern 113 may be a capacitor first electrode (or lower electrode).

The semiconductor layer 120 may include the active pattern ACT and the second capacitor pattern 121. The semiconductor layer 120 may be made of polycrystalline silicon, monocrystalline silicon, amorphous silicon, or the like.

The active pattern ACT may include a first region ACT_a, a second region ACT_b, and a third region ACT_c. The first region ACT_a may be positioned on the left side of the active pattern ACT, the second region ACT_b may be positioned on the right side of the active pattern ACT, and the third region ACT_c may be positioned between the first region ACT_a and the second region ACT_b. The active pattern ACT may include a first active hole H1 and a second active hole H2 that are formed through the active pattern ACT.

The first region ACT_a may be a region ACT in contact with the first source/drain electrode 131 of the second conductive layer 130 in the active pattern ACT. The first region ACT_a may overlap a portion of the first source/drain electrode 131. Also, the first region ACT_a may overlap a portion of the first pattern 111 of the first conductive layer 110.

The planar shape of the first region ACT_a may be defined by the planar shape of the first source/drain electrode 131 that overlaps the active pattern ACT. In some embodiments, the planar shape of the first region ACT_a may be a rectangle. For example, the planar shape of the first region ACT_a may be a rectangle having short sides extending in the first direction DR1 and long sides extending in the second direction DR2, but is not limited thereto.

The second region ACT_b may be a region in contact with the second source/drain electrode 132 of the second conductive layer 130 in the active pattern ACT. The second region ACT_b may overlap a portion of the second source/drain electrode 132. Also, the second region ACT_b may overlap a portion of the second pattern 112 of the first conductive layer 110.

The second region ACT_b may face the first region ACT_a. The planar shape of the second region ACT_b may be defined by the planar shape of the second source/drain electrode 132 that overlaps the active pattern ACT. In some embodiments, the planar shape of the second region ACT_b may be a rectangle. By way of example, the planar shape of the second region ACT_b may be a rectangle having short sides extending in the first direction DR1 and long sides extending in the second direction DR2, but is not limited thereto.

The first region ACT_a and the second region ACT_b may include a multiple number of carrier ions, and may have higher conductivity and lower electrical resistance than the third region ACT_c.

The third region ACT_c may include a first sub-region ACT_c1, a second sub-region ACT_c2, and a third sub-region ACT_c3.

The first sub-region ACT_c1 may be located in a central region of the active pattern ACT. The first sub-region ACT_c1 may be positioned between the first active hole H1 and the second active hole H2. Also, the first sub-region ACT_c1 may be positioned between the second sub-region ACT_c2 and the third sub-region ACT_c3.

The first sub-region ACT_c1 may overlap a portion of a gate electrode 133 of the second conductive layer 130. Also, the first sub-region ACT_c1 may overlap a portion of the first pattern 111 of the first conductive layer 110.

The second sub-region ACT_c2 may be located between the first region ACT_a and the first sub-region ACT_c1. The second sub-region ACT_c2 may be arranged adjacent to the left edge of the active pattern ACT, and may connect upper and lower ends of the first region ACT_a to the first sub-region ACT_c1. Accordingly, the second sub-region ACT_c2 may be positioned on and under the first active hole H1.

The third sub-region ACT_c3 may be positioned between the second region ACT_b and the first sub-region ACT_c1. The third sub-region ACT_c3 may be arranged adjacent to the right edge of the active pattern ACT, and may connect upper and lower ends of the second region ACT_b to the first sub-region ACT_c1. Accordingly, the second sub-region ACT_c2 may be positioned on and under the second active hole H2.

The first active hole H1 may be provided between the first region ACT_a and the third region ACT_c. The first active hole H1 may be arranged on the right side of the first region ACT_a and may be aligned with the right side of the first region ACT_a. Accordingly, the first active hole H1 partially surrounding the first region ACT_a may be aligned with the right side of the first source/drain electrode 131 of the second conductive layer 130.

The second active hole H2 may be provided between the second region ACT_b and the third region ACT_c. The second active hole H2 may be arranged on the left side of the second region ACT_b and may be aligned with the left side of the second region ACT_b. Accordingly, the second active hole H2 partially surrounding the second region ACT_b may be aligned with the left side of the second source/drain electrode 132 of the second conductive layer 130.

The second capacitor pattern 121 may be arranged to be spaced apart from the active pattern ACT. The second capacitor pattern 121 may be arranged on the right side of the active pattern ACT. The second capacitor pattern 121 may be formed of conductorized polycrystalline silicon, monocrystalline silicon, or amorphous silicon.

The second capacitor pattern 121 may overlap the first capacitor pattern 113. The second capacitor pattern 121 and the first capacitor pattern 113 may constitute the storage capacitor CST together. That is, the second capacitor pattern 121 may be a capacitor second electrode (or upper electrode). In some embodiments, the second capacitor pattern 121 may not overlap the second pattern 112 in a plan view.

The second conductive layer 130 may include the first source/drain electrode 131, the second source/drain electrode 132, and the gate electrode 133.

The first source/drain electrode 131 may overlap the first pattern 111. The first source/drain electrode 131 may be connected to the first pattern 111 through the first contact hole CNT1.

The first source/drain electrode 131 may partially overlap the active pattern ACT. For example, the first source/drain electrode 131 may overlap the first region ACT_a of the active pattern ACT. As stated above, the first source/drain electrode 131 may be in contact with the first region ACT_a of the active pattern ACT, and the first source/drain electrode 131 may electrically connect the first pattern 111 and the first region ACT_a of the active pattern ACT.

In a plan view, the first source/drain electrode 131 may be arranged on the left side of the first active hole H1 included in the active pattern ACT. In a plan view, the mutually opposing one sides of the first source/drain electrode 131 and the first active hole H1 may be in contact with each other. Accordingly, the right side of the first source/drain electrode 131 and the left side of the first active hole H1 may be aligned with each other.

The second source/drain electrodes 132 may be arranged to be spaced apart from the first source/drain electrodes 131. The second source/drain electrode 132 may overlap the second pattern 112. The second source/drain electrode 132 may be connected to the second pattern 112 through the second contact hole CNT2.

The second source/drain electrode 132 may partially overlap the active pattern ACT. For example, the second source/drain electrode 132 may overlap the second region ACT_b of the active pattern ACT. As stated above, the second source/drain electrode 132 may be in contact with the second region ACT_b of the active pattern ACT, and the second source/drain electrode 132 may electrically connect the second pattern 112 and the second region ACT_b of the active pattern ACT.

When FIG. 5 illustrates the first transistor T1, the first source/drain electrode 131 may be a first electrode (or source electrode) of the first transistor T1, and the second source/drain electrode 132 may be a second electrode (or drain electrode) of the first transistor T1. However, without being limited thereto, the reverse configuration is also possible. That is, the first source/drain electrode 131 may be the second electrode (or drain electrode) of the first transistor T1, and the second source/drain electrode 132 may be the first electrode (or source electrode) of the first transistors T1.

In a plan view, the second source/drain electrode 132 may be arranged on the right side of the second active hole H2 included in the active pattern ACT. In a plan view, the mutually opposing one sides of the source/drain electrode 132 and the second active hole H2 may be in contact with each other. Accordingly, the left side of the second source/drain electrode 132 and the right side of the second active hole H2 may be aligned with each other.

The gate electrode 133 may be arranged to be spaced apart from the first source/drain electrode 131 and the second source/drain electrode 132. The gate electrode 133 may be positioned between the first source/drain electrode 131 and the second source/drain electrode 132.

The gate electrode 133 may partially overlap the active pattern ACT. For example, the gate electrode 133 may overlap the first sub-region ACT_c1 of the third region ACT_c of the active pattern ACT. The gate electrode 133 may be positioned between the first active hole H1 and the second active hole H2 in a plan view. A gate signal for driving a transistor may be applied to the gate electrode 133. In some embodiments, the gate electrode 133 may have a shape extending in the second direction DR2. When FIG. 5 illustrates the first transistor T1, the gate electrode 133 may be a gate electrode of the first transistor T1.

Hereinafter, a cross-sectional structure of the circuit layer CCL of the display device 1 will be described with reference to FIGS. 5 to 8. In FIGS. 7 and 8, only the stacked structure up to the pixel defining layer PDL is illustrated, focusing on the circuit layer CCL of the first display substrate 10 described above.

The first conductive layer 110 may be arranged on the first substrate SUB. The first conductive layer 110 may include a material such as molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu), but is not limited thereto.

The first pattern 111 may overlap the first region ACT_a and a portion of the third region ACT_c underneath them. To elaborate, the first pattern 111 may overlap the first region ACT_a and the first and second sub-regions ACT_c1 and c2 of the third region ACT_c of the active pattern ACT. The first pattern 111 may be arranged to cover a portion of the active pattern ACT from below it to protect the active pattern ACT from the external light. For example, the first pattern 111 may prevent a photocurrent from flowing in the third region ACT_c of the active pattern ACT as a result of irradiation of the external light to the third region ACT_c of the active pattern ACT. The first pattern 111 may be a light blocking pattern.

The first pattern 111 may overlap the first active hole H1 of the active pattern ACT. The first pattern 111 may not overlap the second active hole H2 of the active pattern ACT, but is not limited thereto. For example, the first pattern 111 may overlap a portion of the second active hole H2 of the active pattern ACT.

The first pattern 111 may overlap the first source/drain electrode 131 and the gate electrode 133. The first pattern 111 may be connected to the first source/drain electrode 131 through the first contact hole CNT1 which is formed through the first insulating layer 161 and the second insulating layer 162.

The second pattern 112 may be spaced apart from the first pattern 111 on the first substrate SUB. The second pattern 112 may overlap the second region ACT_b and a portion of the third region ACT_c of the active pattern ACT underneath them. For example, the second pattern 112 may overlap the second region ACT_b and the third sub-region ACT_c3 of the third region ACT_c of the active pattern ACT.

The second pattern 112 may overlap the second source/drain electrode 132. The second pattern 112 may be connected to the second source/drain electrode 132 through the second contact hole CNT2 which is formed through the first insulating layer 161 and the second insulating layer 162.

The first capacitor pattern 113 may be spaced apart from the first pattern 111 and the second pattern 112 on the first substrate SUB. The first capacitor pattern 113 may overlap the second capacitor pattern 121 under it. The first insulating layer 161 may be interposed between the first capacitor pattern 113 and the second capacitor pattern 121.

The first insulating layer 161 may be arranged on the first conductive layer 110. The first insulating layer 161 may be arranged to completely cover the first substrate SUB on which the first conductive layer 110 is. According to some embodiments, the first insulating layer 161 may be a buffer layer.

The first insulating layer 161 may include holes constituting the first contact hole CNT1 interconnecting the first pattern 111 and the first source/drain electrode 131 and the second contact hole CNT2 interconnecting the second pattern 112 and the second source/drain electrode 132.

The first insulating layer 161 may be formed as a single layer or multiple layers including silicon oxide, silicon nitride, silicon oxynitride, aluminum oxide, tantalum oxide, hafnium oxide, zirconium oxide, titanium oxide, or the like.

The semiconductor layer 120 may be arranged on the first insulating layer 161. The active pattern ACT may partially overlap the first pattern 111 and the second pattern 112. The left end and the central portion of the active pattern ACT may overlap the first pattern 111, whereas the right end of the active pattern ACT may overlap the second pattern 112. For example, the first region ACT_a and the first and second sub-regions ACT_c1 and ACT_c2 of the active pattern ACT may overlap the first pattern 111, and the second region ACT_b and the third sub-region ACT_c3 of the active pattern ACT may overlap the second pattern 112.

The first and second active holes H1 and H2 included in the active pattern ACT may be formed through the active pattern ACT. Each of the first active hole H1 and the second active hole H2 may be defined by the sidewalls of the active pattern ACT. To elaborate, the first active hole H1 may be defined by the sidewalls of the first region ACT_a and the first and second sub-regions ACT_c1 and ACT_c2 of the active pattern ACT, and the second active hole H2 may be defined by the sidewalls of the second region ACT_b and the first and third sub-regions ACT_c1 and ACT_c3 of the active pattern ACT. Each of the first active hole H1 and the second active hole H2 may expose the first insulating layer 161.

The second capacitor pattern 121 may be spaced apart from the active pattern ACT on the first insulating layer 161. The second capacitor pattern 121 may overlap the first capacitor pattern 113 on the first capacitor pattern 113.

The second insulating layer 162 may be arranged on the semiconductor layer 120. The second insulating layer 162 may be formed in a pattern on the first insulating layer 161 on which the semiconductor layer 120 is formed. The second insulating layer 162 may be interposed between the second conductive layer 130 and the first insulating layer 161 or between the second conductive layer 130 and a portion of the active pattern ACT. For example, the second insulating layer 162 may be interposed between the first insulating layer 161 and the first source/drain electrodes 131, and between the first insulating layer 161 and the second source/drain electrodes 132, and between the first sub-region ACT_c1 of the active pattern ACT and the gate electrode 133. According to some embodiments, the second insulating layer 162 may be a gate insulating film.

The second insulating layer 162 may overlap neither the first region ACT_a of the active pattern ACT nor the second region ACT_b of the active pattern ACT. Also, the second insulating layer 162 may not overlap the second capacitor pattern 121.

The second insulating layer 162 may form the first contact hole CNT1 interconnecting the first pattern 111 and the first source/drain electrode 131, and the second contact hole CNT2 interconnecting the second pattern 112 and the second source/drain electrode 132. Further detailed description of the first and second contact holes CNT1 and CNT2 will be provided later.

The second conductive layer 130 may be arranged on the second insulating layer 162. The second conductive layer 130 may include a base layer 130*a*, a main metal layer 130*b*, and a capping layer 130*c* forming a stacked structure. The base layer 130*a*, the main metal layer 130*b*, and the capping layer 130*c* may all include a conductive material. The base layer 130*a*, the main metal layer 130*b*, and the capping layer 130*c* may be patterned through a single mask process.

According to some embodiments, the sidewalls of the aforementioned constituent layers of the second conductive layer 130 may be aligned with each other. In some embodiments, among the constituent layers of the second conductive layer 130, the sidewall of the layer on positioned on the upper side may not protrude outward, as compared to the sidewall of the layer positioned on the lower side. That is, the second conductive layer 130 may not include a tip structure in which the upper layer protrudes. According to some embodiments, the sidewall of the layer positioned in the lower portion of the second conductive layer 130 may be aligned with the sidewall of the layer positioned in the upper portion of the second conductive layer 130 or may protrude further outwards. No insulating layer may be interposed between the respective constituent layers of the second conductive layer 130 overlapping in the thickness direction.

The base layer 130*a* may boost film formation property of the main metal layer 130*b* such as adhesive strength thereof, or may serve to prevent a reactive material from the second insulating layer 162 therebelow from reaching the main metal layer 130*b*. The base layer 130*a* may include a material such as titanium (Ti), tantalum (Ta), calcium (Ca), chromium (Cr), magnesium (Mg), or nickel (Ni), but is not limited thereto.

The main metal layer 130*b* may be arranged on the base layer 130*a*. The main metal layer 130*b* mainly transmits a signal and may be formed of a low resistance material. The main metal layer 130*b* may have a larger thickness than the base layer 130*a* and the capping layer 130*c*, and may be made of a material having lower resistance. The main metal layer 130*b* may include a material such as copper (Cu), molybdenum (Mo), aluminum (Al), silver (Ag) and the like, but the present disclosure is not limited thereto.

The capping layer 130*c* may be arranged on the main metal layer 130*b* to cover the main metal layer 130*b* from above it, thus protecting it. The capping layer 130*c* may serve to protect the main metal layer 130*b* from a layer arranged on the second conductive layer 130 or an etchant or other chemical material used in the fabricating process of the display device 1. The capping layer 130*c* may be in direct contact with the main metal layer 130*b*.

The first source/drain electrodes 131 may overlap the first pattern 111. The first source/drain electrode 131 may be connected to the first pattern 111 through the first contact hole CNT1 composed of a hole that is formed through the first insulating layer 161 and is defined by the second insulating layer 162 and one sidewall of the active pattern ACT. That is, the first source/drain electrode 131 may be in direct contact the top surface of the first pattern 111 exposed by the first contact hole CNT1.

The first source/drain electrode 131 may overlap the first region ACT_a of the active pattern ACT. The first source/drain electrode 131 may be connected to the first region ACT_a of the active pattern ACT exposed by the second insulating layer 162. That is, the first source/drain electrode 131 may be in direct contact with the top surface of the first region ACT_a of the active pattern ACT exposed by the second insulating layer 162.

One sidewall of the first source/drain electrode 131 arranged on the first region ACT_a of the active pattern ACT may be aligned with one sidewall of the first region ACT_a of the active pattern ACT. The one sidewall of the first region ACT_a of the active pattern ACT aligned with the one sidewall of the first source/drain electrode 131 may be a portion of the sidewall of the active pattern ACT defining the first active hole H1.

The second source/drain electrode 132 may overlap the second pattern 112. The second source/drain electrode 132 may be connected to the second pattern 112 through the second contact hole CNT2 composed of a hole that is formed through the first insulating layer 161 and is defined by the second insulating layer 162 and the other sidewall of the active pattern ACT. That is, the second source/drain electrode 132 may be in direct contact with the top surface of the second pattern 112 exposed by the second contact hole CNT2.

The second source/drain electrode 132 may overlap the second region ACT_b of the active pattern ACT. The second source/drain electrode 132 may be connected to the second region ACT_b of the active pattern ACT exposed by the second insulating layer 162. That is, the second source/drain electrode 132 may be in direct contact with the top surface of the second region ACT_b of the active pattern ACT exposed by the second insulating layer 162.

One sidewall of the second source/drain electrode 132 arranged on the second region ACT_b of the active pattern ACT may be aligned with one sidewall of the second region ACT_b of the active pattern ACT. The one sidewall of the second region ACT_b of the active pattern ACT aligned with the one sidewall of the second source/drain electrode 132 may be a portion of the active pattern ACT defining the second active hole H2.

The gate electrode 133 may overlap the first sub-region ACT_c1 of the active pattern ACT. The second insulating layer 162 may be interposed between the gate electrode 133 and the first sub-region ACT_c1 of the active pattern ACT.

The third insulating layer 163 may be arranged on the second conductive layer 130. The third insulating layer 163 may be a passivation layer serving to cover and protect the second conductive layer 130. The third insulating layer 163 may be arranged on the entire surface of the display area of the first substrate SUB. The third insulating layer 163 may include a hole constituting the third contact hole CNT3 connecting the pixel electrode PXE and the first source/drain electrode 131 to each other. The third insulating layer 163 may include an inorganic insulating material such as silicon oxide, silicon nitride, or silicon oxynitride.

The via layer 164 may be arranged on the third insulating layer 163. The via layer 164 may be arranged on the third insulating layer 163 to completely cover the top surface of the third insulating layer 163.

The via layer 164 may include an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB). The via layer 164 may further include a photosensitive material, but the present disclosure is not limited thereto. According to some embodiments, the via layer 164 may include polyimide.

The via layer 164 may include a step portion. The via layer 164 may include a stepped structure having regions of different heights. The via layer 164 may include a first portion 164_1 having a first height and a second portion 164_2 having a second height lower than the first height. The height of the via layer 164 may be measured from the reference surface such as one surface of the first substrate SUB. The via layer 164 may have a substantially flat surface in each region (portion) irrespective of presence or absence of a pattern arranged therebelow or the shape of the pattern. The via layer 164 may have the stepped structure at the boundary between the regions (portions).

The first portion 164_1 of the via layer 164 may overlap the pixel electrode PXE positioned thereon. The second portion 164_2 of the via layer 164 may not overlap the pixel electrode PXE. The second portion 164_2 of the via layer 164 may be arranged along the periphery of the pixel electrode PXE, and may form a grid-shaped puddle in the display area.

The pixel electrode PXE may be arranged on the via layer 164. The pixel electrode PXE may be an anode electrode. The pixel electrode PXE may be electrically connected to the first source/drain electrode 131 through the third contact hole CNT3 which is formed through the via layer 164 and the third insulating layer 163.

For example, the pixel electrode PXE may have a stacked structure formed by stacking a material layer having a high work function, such as indium tin oxide (ITO), indium zinc oxide (IZO), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof.

The pixel defining layer PDL may be arranged on the pixel electrode PXE. The pixel defining layer PDL is arranged to overlap the edge portion of the pixel electrode PXE. The pixel defining layer PDL may also be arranged on the third contact hole CNT3 to overlap it. The pixel defining layer PDL may completely fill the inside of the third contact hole CNT3. The pixel defining layer PDL is also arranged on the via layer 164 where the pixel electrode PXE is not formed. The pixel defining layer PDL may fill the step portion (puddle) formed around the pixel electrode PXE by the second portion 164_2 of the via layer 164, thus compensating the height difference. According to some embodiments, the height of the pixel defining layer PDL overlapping the first portion 164_1 of the via layer 164 and the height of the pixel defining layer PDL overlapping the second portion 164_2 of the via layer 164 may be same, but the present disclosure is not limited thereto.

Figure 9:
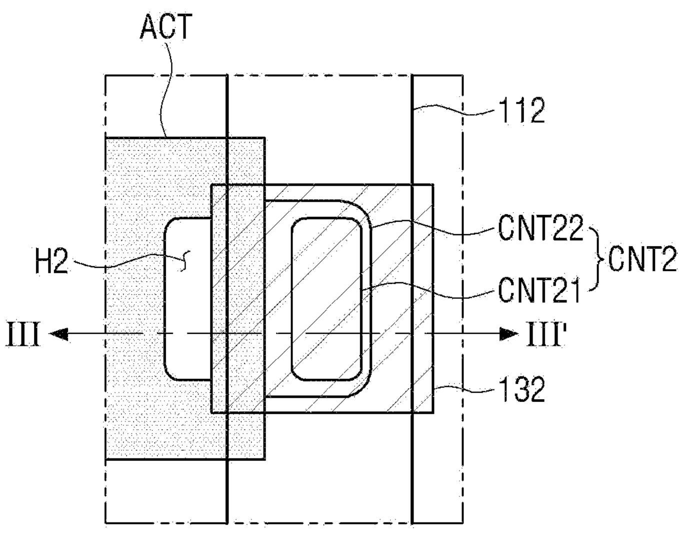
FIG. 9 is a plan layout view illustrating the relative arrangement of the active pattern, the second source/drain electrode, the second pattern, and the second contact hole included in the transistor of FIG. 5 according to some embodiments.
Figure 9:
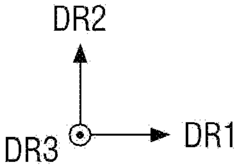
Figure 10:
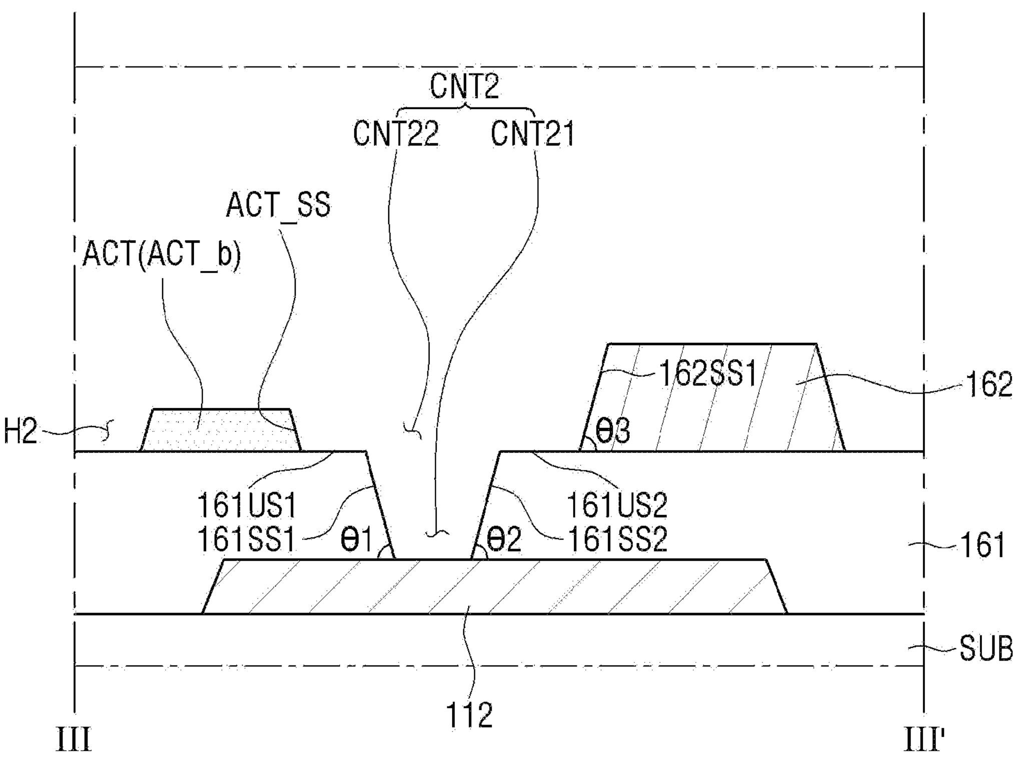
FIG. 10 is a schematic cross-sectional view taken along the line III-III' of FIG. 9 according to some embodiments.
Figure 11:
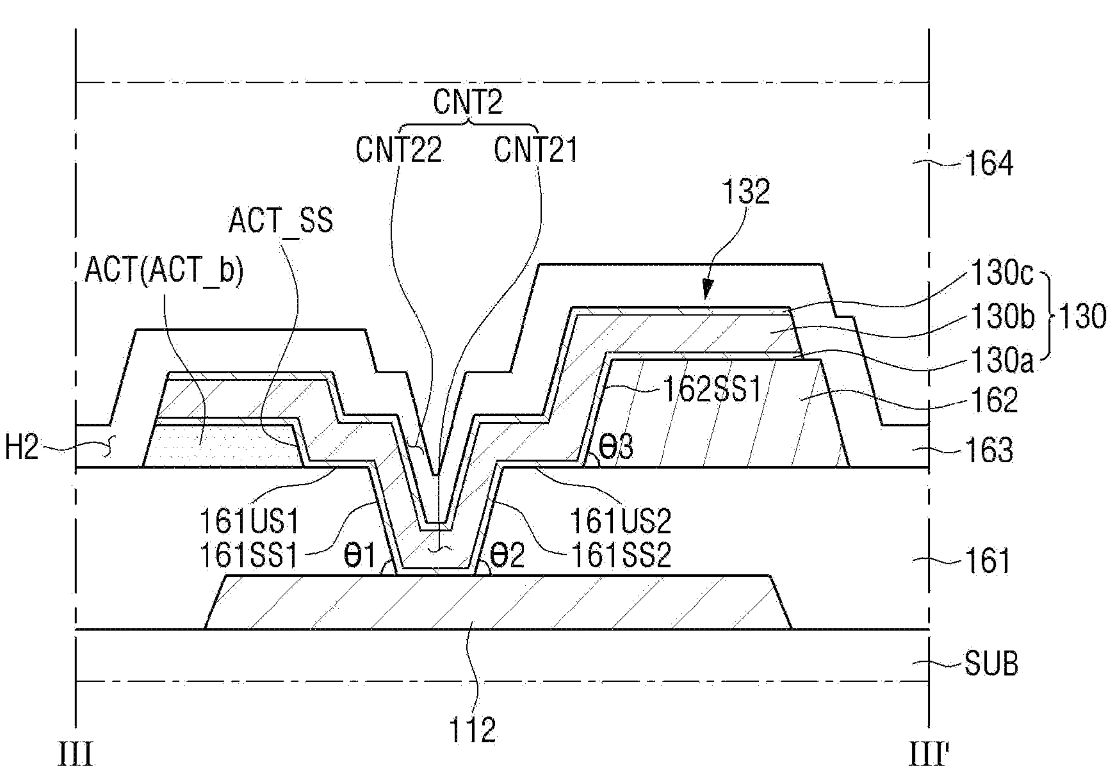
FIG. 11 is a cross-sectional view of a display device taken along the line III-III' in FIG. 9 according to some embodiments.

FIG. 9 is a plan layout view illustrating the relative arrangement of the active pattern, the second source/drain electrode, the second pattern, and the second contact hole included in the transistor of FIG. 5. FIG. 10 is a schematic cross-sectional view taken along the line III-III' of FIG. 9. FIG. 11 is a cross-sectional view of a display device taken along the line III-III' in FIG. 9.

Hereinafter, the shape and relative arrangement of the holes constituting the contact holes connecting the second conductive layer 130 and the first conductive layer 110 will be described in detail with reference to FIGS. 9 to 11.

Meanwhile, FIGS. 9 to 11 illustrate the second pattern 112, the second source/drain electrode 132, and the second contact hole CNT2 interconnecting the second pattern 112 and the second source/drain electrode 132. Because the structure of the second contact hole CNT2 is substantially the same as that of the first contact hole CNT1, description of the first contact hole CNT1 will be omitted, and the description of the second contact hole CNT2 will be referred to.

In addition, for simplicity of description, FIG. 10 illustrates the cross-sectional structure of the first and second insulating layers 161 and 162 and the active pattern ACT forming the contact hole CNT2 and the cross-sectional structure of the second pattern 112, and FIG. 11 further illustrates the second source/drain electrode 132, the third insulating layer 163, and the via layer 164 in addition to the cross-sectional structure of FIG. 10.

First, referring to FIGS. 9 and 10, the second contact hole CNT2 may include a first hole CNT21 and a second hole CNT22 that are spatially connected to each other. The first hole CNT21 may be a hole that is formed through the first insulating layer 161 and defined by sidewalls 161SS1 and 161SS2 of the first insulating layer 161. The second hole CNT22 may be a hole defined by a sidewall ACT_SS of the active pattern ACT and a sidewall 162SS1 of the second insulating layer 162.

In cross-sectional view, the sidewalls 161SS1 and 161SS2 of the first insulating layer 161 defining the first hole CNT21 may include the first sidewall 161SS1 positioned on the active pattern ACT side and the second sidewall 161SS2 positioned on the second insulating layer 162 side.

According to some embodiments, the first hole CNT21 may be located inside the second hole CNT22 in a plan view. That is, the width of the first hole CNT21 may be smaller than the width of the second hole CNT22. The edge of the first hole CNT21 may not be in contact with the edge of the second hole CNT22. Accordingly, the active pattern ACT and the second insulating layer 162 defining the second hole CNT22 and the second insulating layer 162 may not overlap the first hole CNT21 in a plan view. Also, the second hole CNT22 may expose top surfaces 161US1 and 161US2 of the first insulating layer 161 in the region around the first hole CNT21.

Because the first hole CNT21 is located inside the second hole CNT22 in a plan view, the sidewall ACT_SS of the active pattern ACT defining the second hole CNT22 may be arranged on the inner side than the first sidewall 161SS1 of the first insulating layer 161 defining the first hole CNT21 in cross-sectional view. Accordingly, the active pattern ACT may be arranged on the top surface 161US1 of the first insulating layer 161 in the region around the first hole CNT21 to expose a portion of the top surface 161US1 of the first insulating layer 161.

In addition, because the first hole CNT21 is located inside the second hole CNT22 in a plan view, the sidewall 162SS1 of the second insulating layer 162 defining the second hole CNT22 may be arranged on the inner side than the second sidewall 161SS2 of the first insulating layer 161 defining the first hole CNT21. Accordingly, the second insulating layer 162 may expose a portion of the top surface 161US2 of the first insulating layer 161 in the region around the first hole CNT21.

According to some embodiments, the sidewalls 161SS1 and 161SS2 of the first insulating layer 161 defining the first hole CNT21 may each have a positive taper shape. In addition, the sidewall 162SS1 of the second insulating layer 162 defining the second hole CNT22 may also have a positive taper shape.

In the present specification, the positive taper shape may be defined as a shape having an inclined side surface with a bottom surface further protruding than a top surface thereof in cross-sectional view. That is, when the cross-sectional shape is a positive taper shape, the angle between the sidewall and the plane on which the bottom surface lies may be an acute angle. In addition, an inverted taper shape may be defined as a shape having an inclined side surface with a top surface further protruding than the bottom surface thereof in cross-sectional view. That is, when the cross-sectional shape is an inverted taper shape, the angle between the sidewall and the plane on which the bottom surface lies may be an obtuse angle.

The angle formed between the sidewalls 161SS1 and 161SS2 of the first insulating layer 161 and the plane on which the bottom surface of the first insulating layer 161 lies (e.g., the top surface of the second pattern 112) may be an acute angle. The angle formed between the first sidewall 161SS1 of the first insulating layer 161 defining the first hole CNT21 and the bottom surface of the first insulating layer 161 may be defined as a first inclination angle θ1, and the angle formed between the second sidewall 161SS2 of the first insulating layer 161 defining the second hole CNT22 and the bottom surface of the first insulating layer 161 may be defined as a second inclination angle θ2.

According to some embodiments, each of the first inclination angle θ1 and the second inclination angle θ2 may be an acute angle. Each of the first inclination angle θ1 and the second inclination angle θ2 may be an acute angle of 70° or less, but is not limited thereto. Also, the first inclination angle θ1 and the second inclination angle θ2 may be symmetrical, having the same size, but the present disclosure is not limited thereto.

The angle formed between the plane on which the bottom surface of the second insulating layer 162 lies (e.g., the top surface 161US2 of the first insulating layer 161) and the sidewall 162SS1 of the second insulating layer 162 may be an acute angle. The angle formed between the sidewall 162SS1 of the second insulating layer 162 defining the second hole CNT22 and the bottom surface of the second insulating layer 162 may be defined as a third inclination angle θ3. The third inclination angle θ3 may be an acute angle. The third inclination angle θ3 may be an acute angle of 70° or less, but is not limited thereto. As will be described later, the process for forming the second contact hole CNT2 may include a process of etching the first insulating layer 161 and the second insulating layer 162. The first and second insulating layers 161 and 162 may be etched in a single process to form the second contact hole CNT2. Accordingly, the inclination angle of the sidewalls 161SS1 and 161SS2 of the first insulating layer 161 defining the first hole CNT21 and the inclination angle of the sidewall 162SS1 of the second insulating layer 162 defining the second hole CNT22 may be substantially same.

Meanwhile, when the first inclination angle θ1 or the second inclination angle 82 is an obtuse angle or a right angle, a seam of the third insulating layer 163 may be formed in the region around the first hole CNT21 in the process of forming the third insulating layer 163 to cover the second conductive layer 130 in the fabricating process of the display device 1. Such a seam of the third insulating layer 163 is a defect of the display device 1 and may cause corrosion or failure of the second conductive layer 130 in a subsequent process. In view of this, by forming the sidewalls 161SS1 and 161SS2 of the first insulating layer 161 defining the first hole CNT21 included in the second contact hole CNT2 to be inclined at an acute inclination angle, the reliability of the fabricating process of the display device 1 may be improved, and, thus, the quality of the display device 1 may be improved.

Referring to FIGS. 10 and 11, the second source/drain electrode 132 may be arranged on the active pattern ACT and the second insulating layer 162. The second source/drain electrode 132 may be connected to the second pattern 112 through the second contact hole CNT2. The second source/drain electrode 132 may be formed to fill the first hole CNT21 and the second hole CNT22 included in the second contact hole CNT2. For example, the second source/drain electrode 132 may be arranged to cover the sidewalls 161SS1 and 161SS2 of the first insulating layer 161 defining the first hole CNT21, the sidewall ACT_SS of the active pattern ACT defining the second hole CNT22, and the sidewall 162SS1 of the second insulating layer 162 defining the second hole CNT22.

As described above, the first hole CNT21 may be arranged inside the second hole CNT22 in a plan view, and the second hole CNT22 may expose the top surfaces 161US1 and 161US2 of the first insulating layer 161. Accordingly, the second source/drain electrode 132 may be in contact with the top surfaces 161US1 and 161US2 exposed by the second hole CNT22.

The third insulating layer 163 may be arranged on the second conductive layer 130. The third insulating layer 163 may have a surface shape reflecting stepped portions therebelow. Accordingly, in the region overlapping the second contact hole CNT2, the third insulating layer 163 may have a surface shape reflecting the stepped portions of the second source/drain electrodes 132.

According to some embodiments, as the sidewalls 161SS1 and 161SS2 of the first insulating layer 161 defining the first hole CNT21 are formed to have an acute inclination angle, it is possible to prevent formation of a seam in the process of depositing the second conductive layer 130 and the third insulating layer 163 formed to cover the sidewalls 161SS1 and 161SS2 of the first insulating layer 161. Accordingly, the reliability of the fabricating process of the display device 1 may be improved, and the quality of the display device 1 may be bettered.

Hereinafter, a method of fabricating the display device 1 will be described.

FIGS. 12 to 31 are plan layout views and cross-sectional views illustrating individual process steps of a method of fabricating a display device according to some embodiments.

Figure 12:
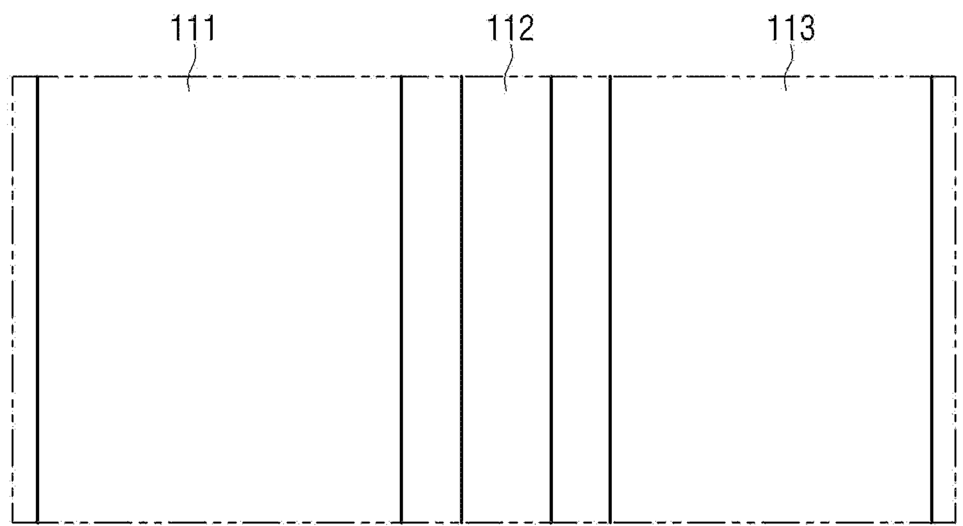
FIGS. 12 to 31 are plan layout views and cross-sectional views illustrating individual process steps of a method of fabricating a display device according to some embodiments.
Figure 12:
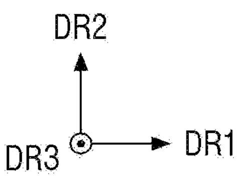
Figure 13:
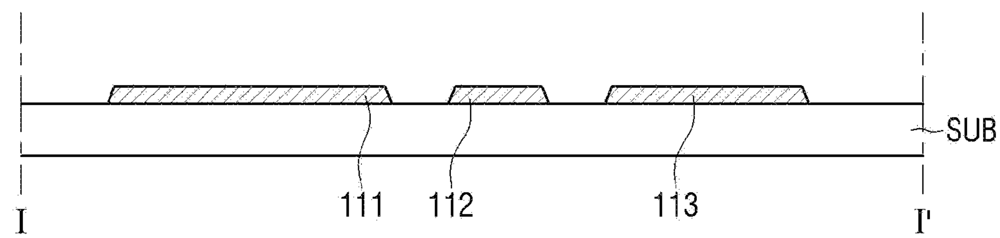
Figure 13:
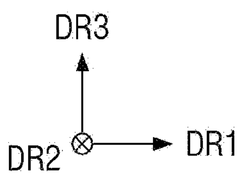

Referring to FIGS. 12 and 13, the patterned first conductive layer 110 is first formed on the first substrate SUB. The patterns of the first conductive layer 110 may be formed by the same mask process. To elaborate, a material layer for a first conductive layer is deposited on the entire surface of the first substrate SUB. Subsequently, a photoresist layer is applied on the material layer for the first conductive layer, a photoresist pattern is formed through exposure and development, and etching is performed using this photoresist pattern as an etching mask. Thereafter, the photoresist pattern is removed through a process such as stripping to thereby form the first pattern 111, the second pattern 112, and the first capacitor pattern 113 as shown in FIGS. 12 and 13.

Figure 14:
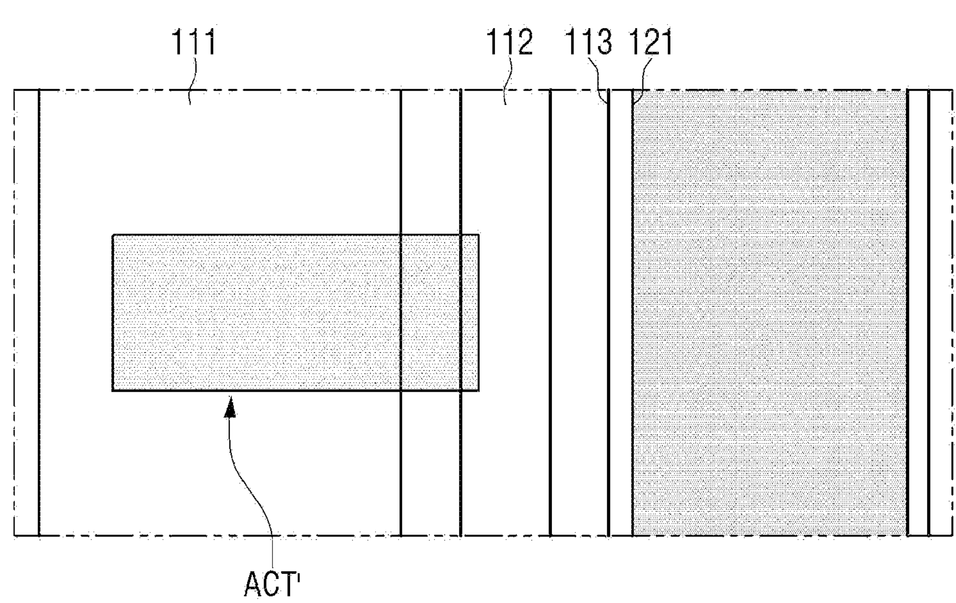
Figure 14:
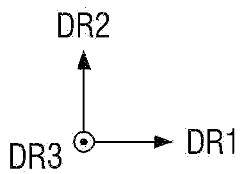
Figure 15:
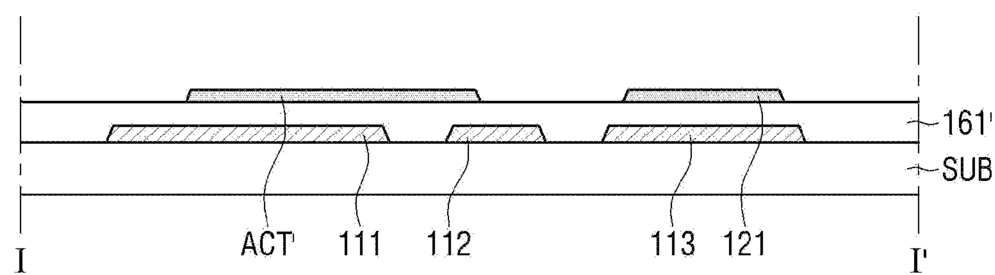
Figure 15:
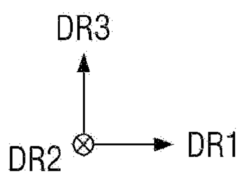
Figure 16:
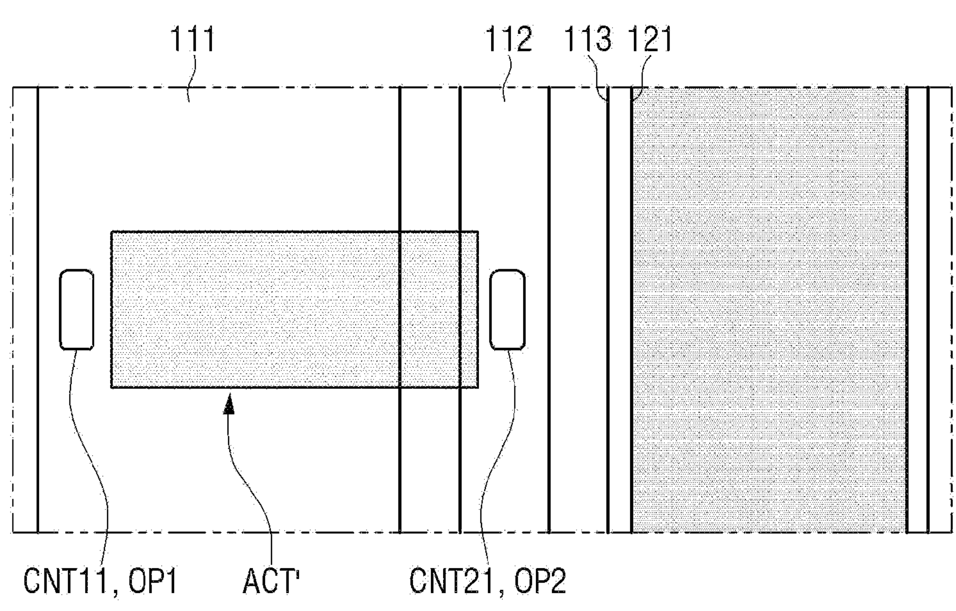
Figure 16:
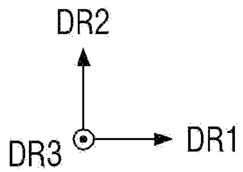

Then, referring to FIGS. 14 and 15, a first insulating layer 161' is formed on the entire surface of the first substrate SUB on which the first conductive layer 110 is formed. Thereafter, the patterned semiconductor layer 120 is formed on the first insulating layer 161'. The patterns of the semiconductor layer 120 may be formed by the same mask process. For example, an oxide semiconductor is deposited on the entire surface of the first insulating layer 161 and then patterned through a photolithography process to form an active pattern ACT' and the second capacitor pattern 121 as shown in FIGS. 14 and 15.

Next, referring to FIGS. 16 to 19, a second insulating layer 162' is stacked on the first insulating layer 161' on which the first conductive layer 110 is formed, and a plurality of holes are formed. The plurality of holes may include a plurality of patterned holes CNT11, OP1, CNT21, and OP2 exposing a portion of the first conductive layer 110. The patterned plurality of holes CNT11, OP1, CNT21, and OP2 may be spaced apart from the active pattern ACT' in a plan view. For example, the plurality of holes include the first hole CNT11 and the third hole OP1 exposing the first pattern 111 of the first conductive layer 110, and the first hole CNT21 and the third hole OP2 exposing the second pattern 112 of the first conductive layer 110. The plurality of holes may be formed by the same mask process.

Figure 17:
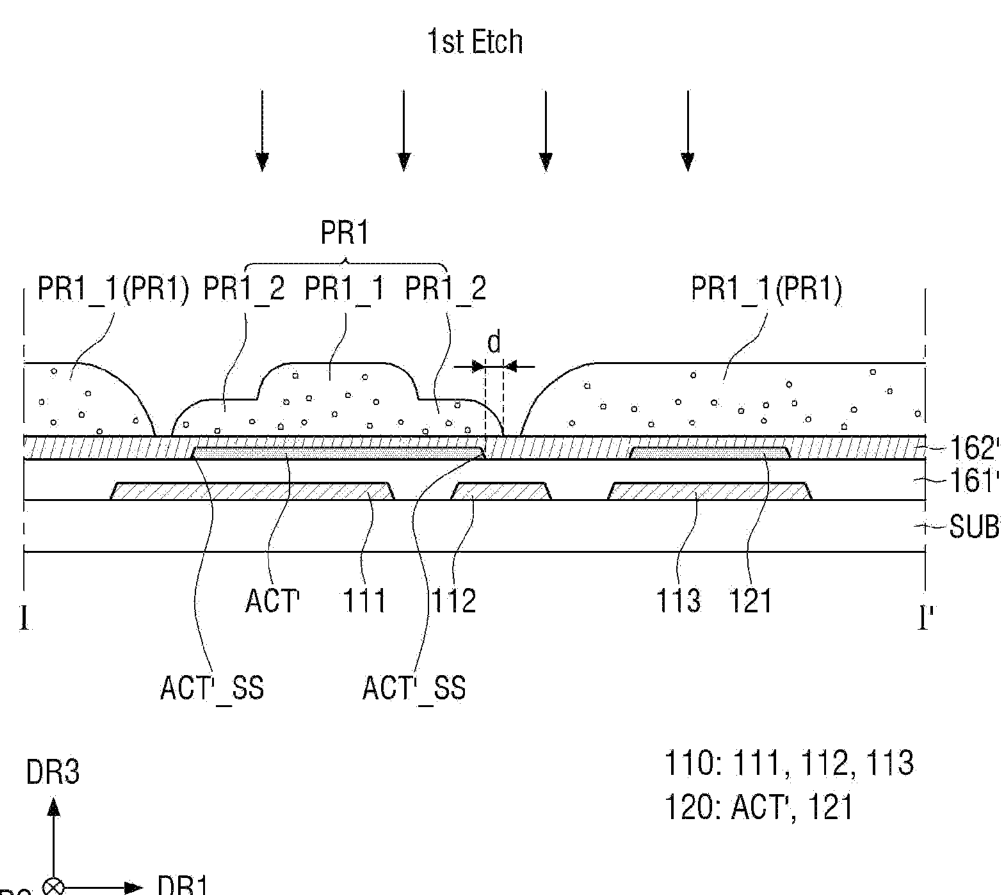

First, referring to FIG. 17, a first mask pattern PR1 exposing a portion of the first pattern 111 and the second pattern 112 is formed on the second insulating layer 162'. The first mask pattern PR1 may be formed in a region other than the region in which the first holes CNT11 and CNT21 are formed. The first mask pattern PR1 may not overlap the region in which the first holes CNT11 and CNT21 are formed.

The first mask pattern PR1 arranged on the active pattern ACT' may include a first mask region PR1_1 having a first thickness at the center of the active pattern ACT', and a second mask region PR1_2 having a second thickness smaller than the first thickness at the periphery of the active pattern ACT'.

The second mask region PR1_2 may overlap both sidewalls ACT'_SS (or the periphery) of the active pattern ACT'. The second mask region PR1_2 may completely cover the sidewalls ACT'_SS of the active pattern ACT'. Both ends of the second mask region PR1_2 may protrude further outwards than the sidewalls ACT'_SS of the active pattern ACT'. That is, both ends of the second mask region PR1_2 may be formed to protrude further than both sidewalls ACT'_SS of the active pattern ACT' by a distance (e.g., a set or predetermined distance) d. The distance (e.g., the set or predetermined distance) d may be adjusted within a range in which the second mask region PR1_2 protrudes outward from the active pattern ACT' while overlapping the first pattern 111 and the second pattern 112. Both ends of the second mask region PR1_2 may overlap the first pattern 111 and the second pattern 112 of the first conductive layer 110 connected with the second conductive layer 130.

According to some embodiments, the first mask pattern PR1 may be formed by stacking a photosensitive material such as a photoresist and exposing the photosensitive material layer to light using a halftone photomask. Accordingly, the first mask pattern PR1 having different thicknesses depending on positions may be formed.

Figure 18:
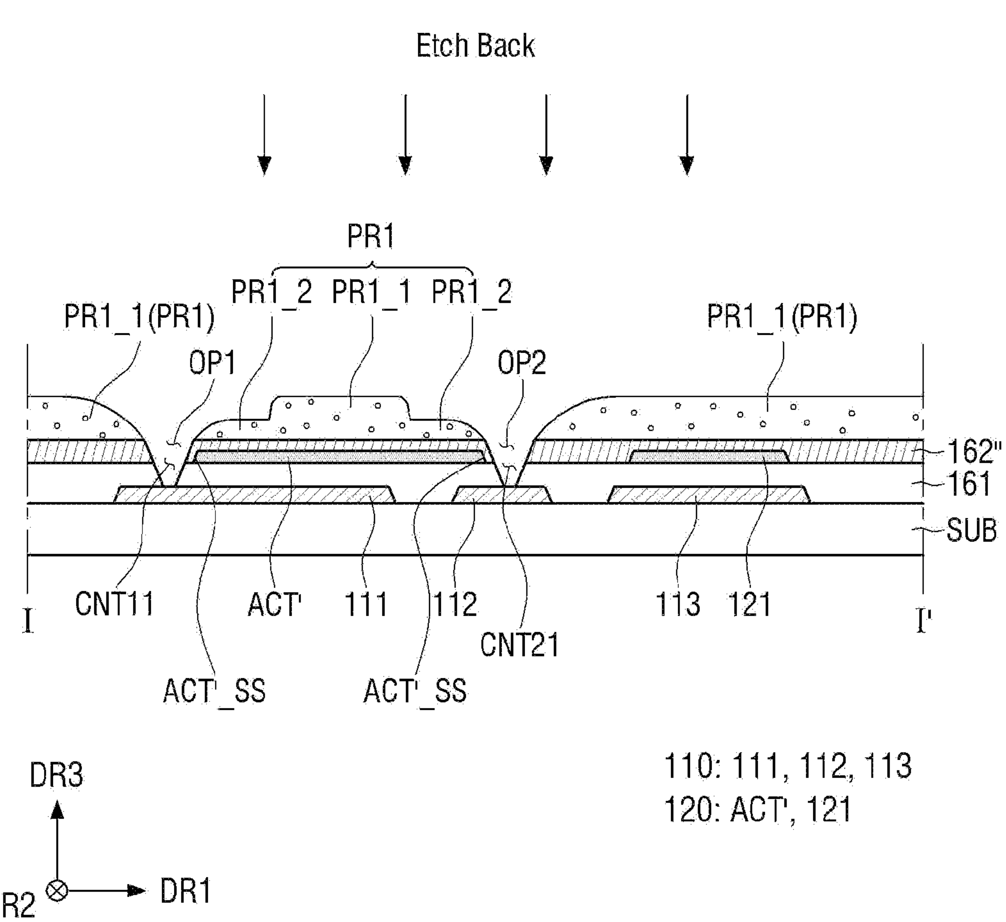

Then, referring to FIGS. 17 and 18, by performing the first etching process ($1^{st}$ Etch) of etching the second insulating layer 162' and the first insulating layer 161' using the first mask pattern PR1 as an etching mask, the plurality of holes CNT11, OP1, CNT21, and OP2 exposing the first pattern 111 and the second pattern 112 are formed. According to some embodiments, the first etching process ($1^{st}$ Etch) of etching the first insulating layer 161' and the second insulating layer 162' may be a dry etching process using a gas.

The plurality of first holes CNT11 and CNT21 may be formed through the first insulating layer 161, while exposing the first pattern 111 and the second pattern 112. The plurality of third holes OP1 and OP2 may be formed through a second insulating layer 162", while exposing the first pattern 111 and the second pattern 112 together with the first holes CNT11 and CNT21. The first hole CNT11 and the third hole OP1 exposing the first pattern 111 may overlap each other and be spatially connected. The first hole CNT21 and the third hole OP2 exposing the second pattern 112 may overlap each other and be spatially connected.

Figure 19:
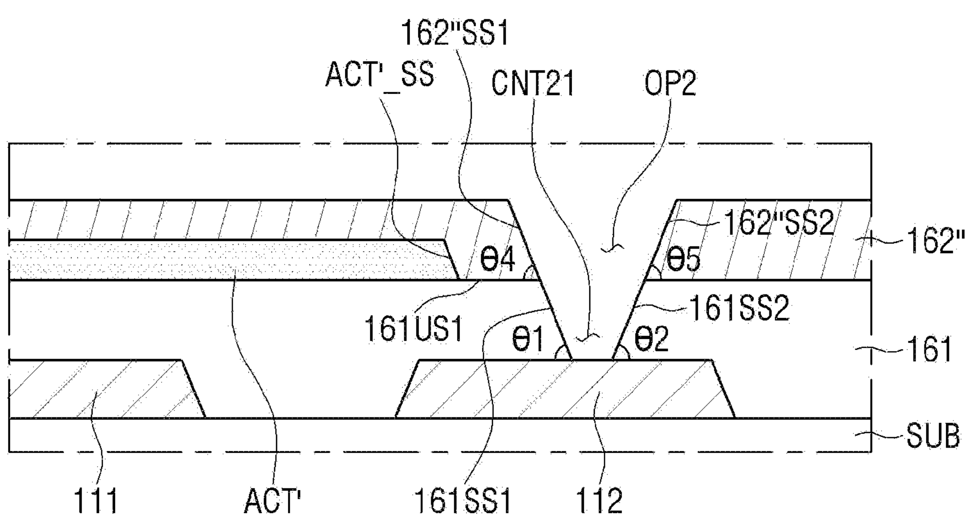
Figure 19:
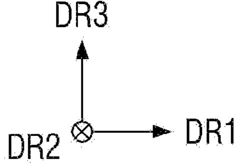
Figure 20:
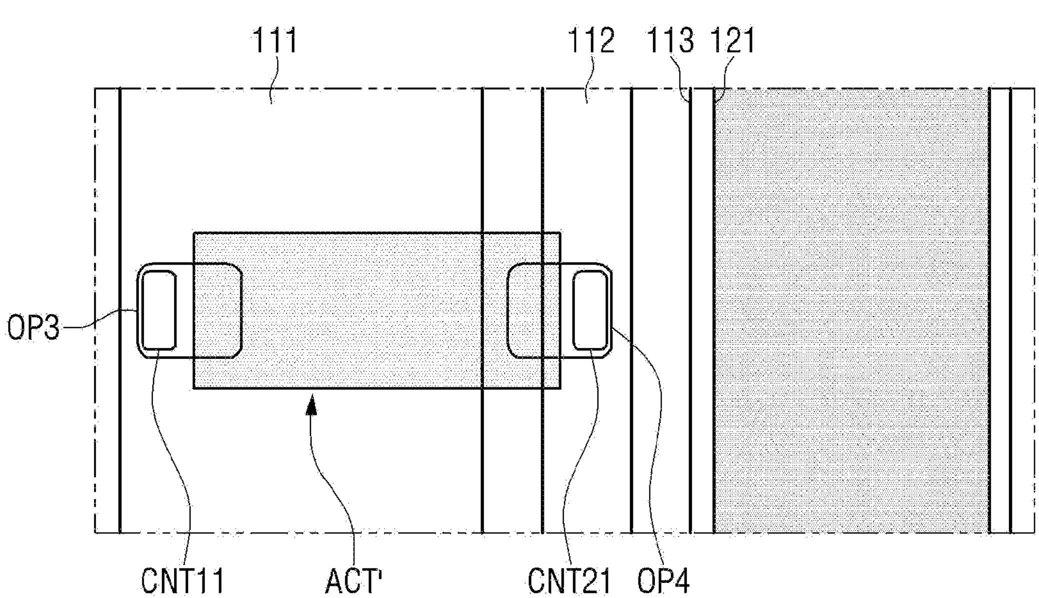
Figure 20:
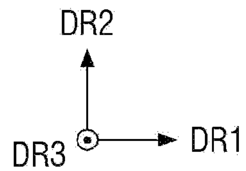

For example, referring to FIG. 19, by forming the first hole CNT21 and the third hole OP2 exposing the second pattern 112 to overlap each other, the sidewalls 161SS1 and 161SS2 of the first insulating layer 161 defining the first hole CNT21 may be aligned with the sidewalls 162"SS1 and 162"SS2 of the second insulating layer 162" defining the third hole OP2. For example, the first sidewall 161SS1 of the first insulating layer 161 arranged on the active pattern ACT' side and the sidewall 162"SS1 of the second insulating layer 162" arranged on the active pattern ACT' side may be aligned with each other. In addition, the second sidewall 161SS2 of the first insulating layer 161 arranged on the opposite side to the active pattern ACT' and the second sidewall 162"SS2 of the second insulating layer 162" arranged on the opposite side to the active patter ACT' may be aligned with each other.

The first inclination angle θ1 of the first sidewall 161SS1 of the first insulating layer 161, the second inclination angle θ2 of the second sidewall 161SS2 of the first insulating layer 161, the fourth inclination angle θ4 of the first sidewall 162"SS1 of the second insulating layer 162", and the fifth inclination angles 85 of the second sidewall 162"SS2 of the second insulating layer 162" formed through the first etching process (1$^{st}$ Etch) may be all acute angles. Each of the first inclination angle θ1, the second inclination angle θ2, the fourth inclination angle θ4, and the fifth inclination angle θ5 may be an acute angle of 70° or less, but is not limited thereto.

Meanwhile, by forming the second mask region PR1_2 of the first mask pattern PR1 arranged on the active pattern ACT' to protrude from both sidewalls ACT'_SS of the active pattern ACT', the second insulating layer 162" remaining through the first etching process (1$^{st}$ Etch) may cover the sidewalls ACT'_SS of the active pattern ACT'. Further, the second insulating layer 162" may extend outward from both sidewalls ACT'_SS of the active pattern ACT' to cover the top surface 161US1 of the first insulating layer 161 arranged on the active pattern ACT' side.

Next, referring to FIGS. 20 to 23, by performing the second etching process (2$^{nd}$ Etch) of etching the second insulating layer 162" using the remaining first mask pattern PR1 as an etching mask, the plurality of second holes CNT12 and CNT22 exposing both ends of the active pattern ACT' are formed.

Figure 21:
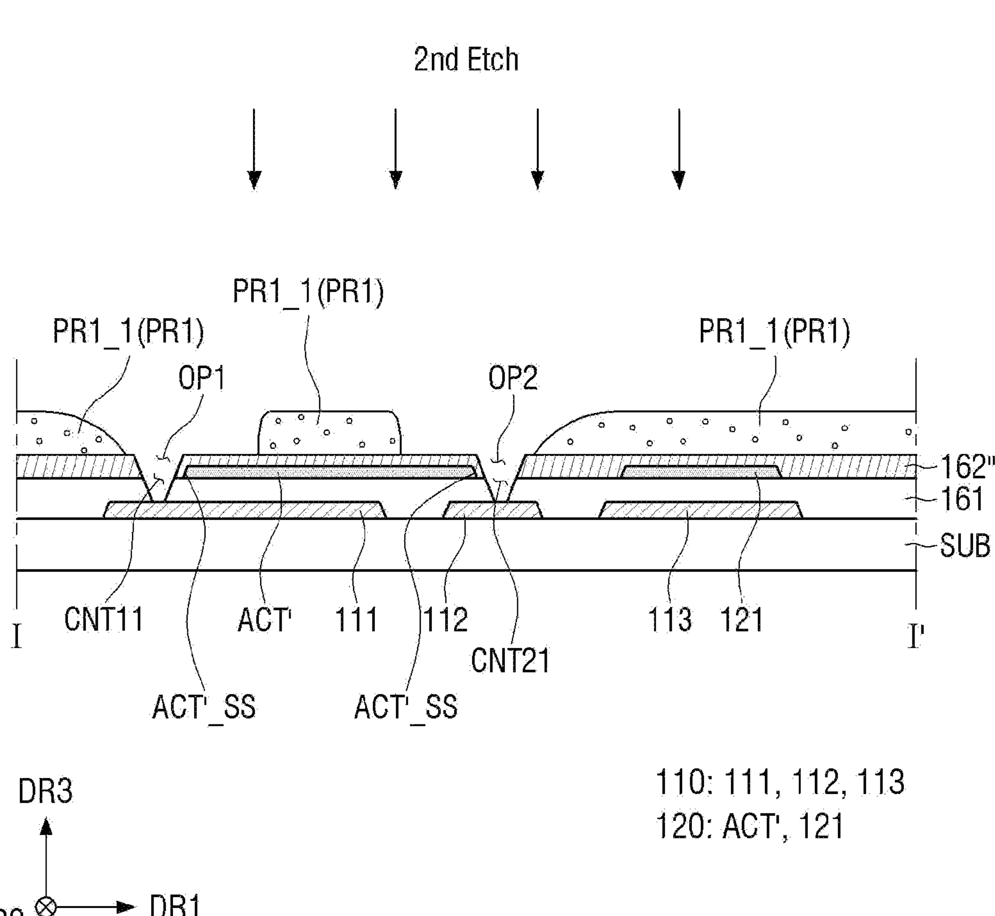

First, referring to FIGS. 18 and 21, a process of partially removing the remaining first mask pattern PR1 is performed. The process of partially removing the first mask pattern PR1 may be carried out through an etch back process. The thickness of the first mask pattern PR1 of FIG. 18 may be reduced in overall through the etch back process. Accordingly, the second mask region PR1_2 having the relatively small thickness and a portion of the periphery of the first mask region PR1_1 of the first mask pattern PR1 are removed, so only the first mask region PR1_1 of the first mask pattern PR1 may be left as shown in FIG. 21. Accordingly, the second insulating layer 162" may be exposed by the first mask pattern PR1.

Figure 22:
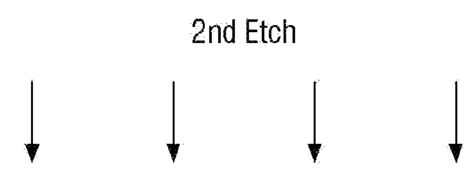
Figure 22:
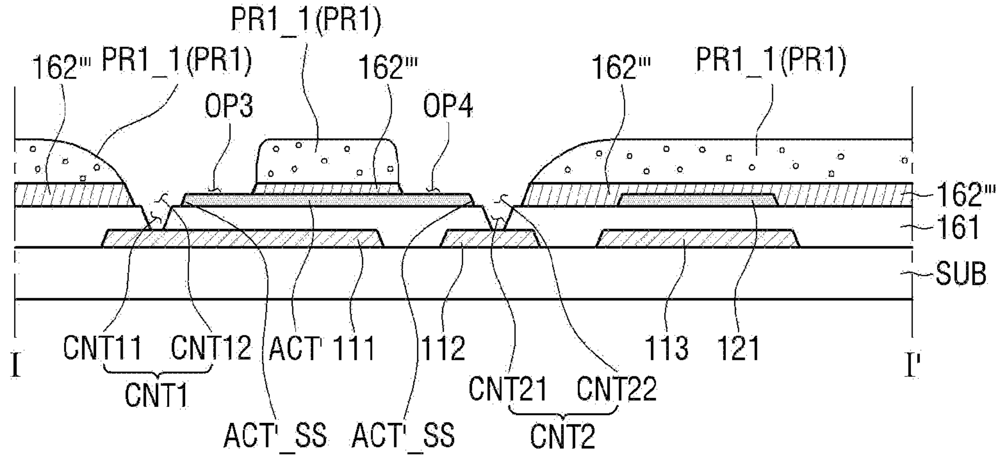
Figure 22:
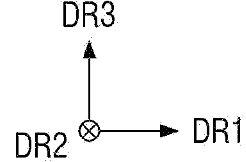
Figure 23:
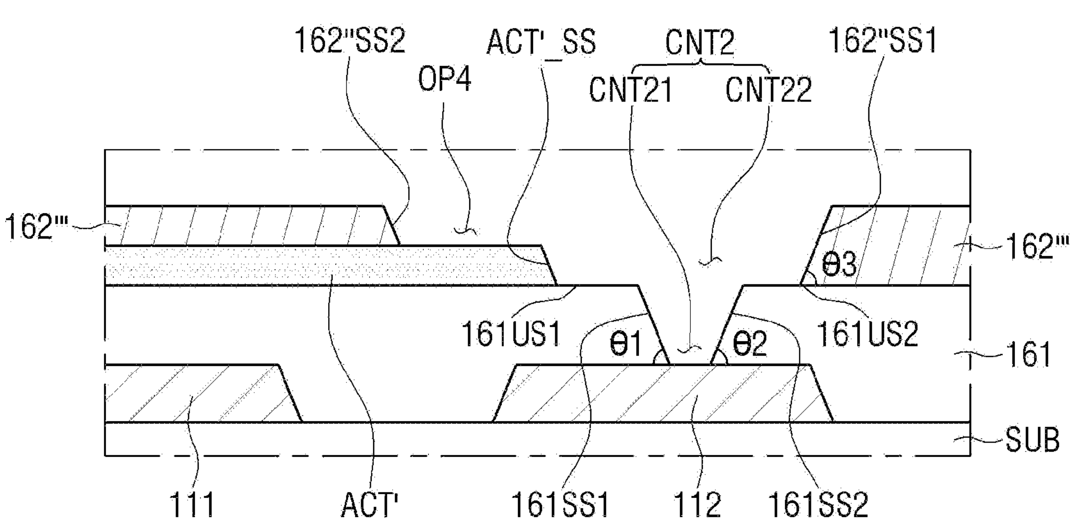
Figure 23:
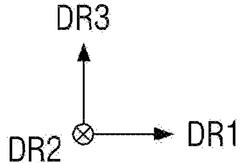

Subsequently, referring to FIGS. 21 to 23, by performing the second etching process (2$^{nd}$ Etch) of etching the second insulating layer 162" using the first mask pattern PR1 as an etching mask, the plurality of second holes CNT12 and CNT22 and the plurality of fourth holes OP3 and OP4 and exposing both end regions of the active pattern ACT' are formed. According to some embodiments, the second etching process (2$^{nd}$ Etch) of etching the second insulating layer 162" may be a dry etching process using a gas.

A portion of the second insulating layer 162" exposed by the first mask pattern PR1 is removed through the second etching process (2$^{nd}$ Etch), so that the plurality of second holes CNT12 and CNT22 and the plurality of fourth holes OP3 and OP4 may be formed.

The plurality of second holes CNT12 and CNT22 may be defined by the sidewall ACT'_SS of the active pattern ACT' and a sidewall 162'"SS1 of a second insulating layer 162'" facing the sidewall ACT'_SS of the active pattern ACT'. The plurality of fourth holes OP3 and OP4 may be defined by the sidewall 162'"SS1 of the second insulating layer 162'" arranged on the active pattern ACT' and the sidewall 162'"SS1 of the second insulating layer 162'" facing the sidewall ACT'_SS of the active pattern ACT'.

Meanwhile, prior to performing the second etching process (2$^{nd}$ Etch), the second insulating layer 162" is formed to completely cover the entire region of the active pattern ACT' including both sidewalls ACT'_SS thereof. Accordingly, it is possible to prevent the active pattern ACT' from being exposed to the gas used in the process of etching the second insulating layer 162". Therefore, it is possible to prevent a portion of the active pattern ACT' from being damaged by the gas used in the etching process for forming the contact holes CNT1 and CNT2.

Next, a process of removing the first mask pattern PR1 through a process such as stripping is performed.

Figure 24:
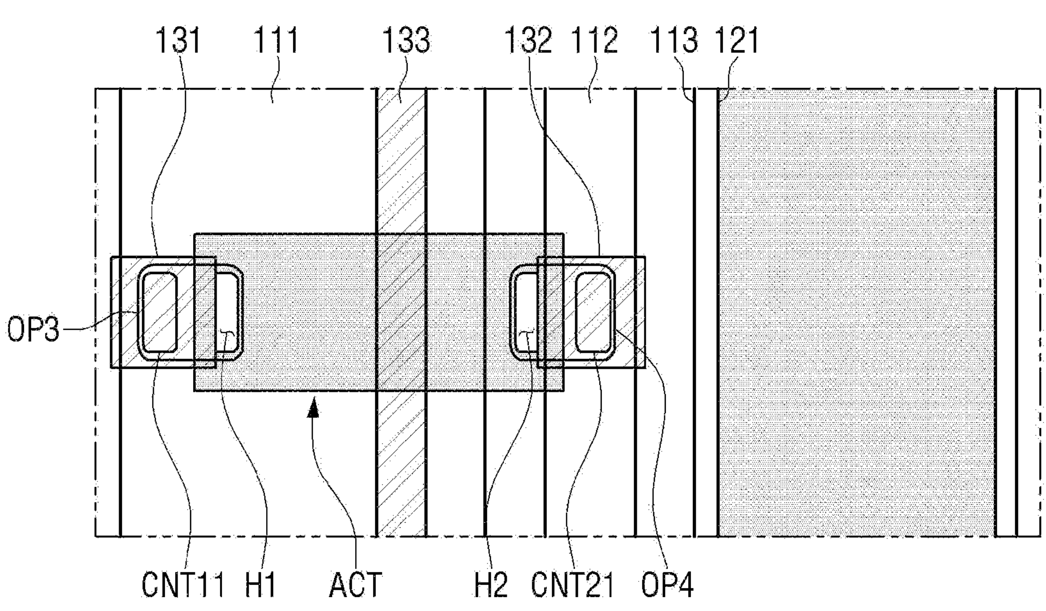
Figure 24:
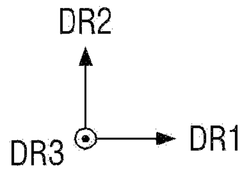
Figure 25:
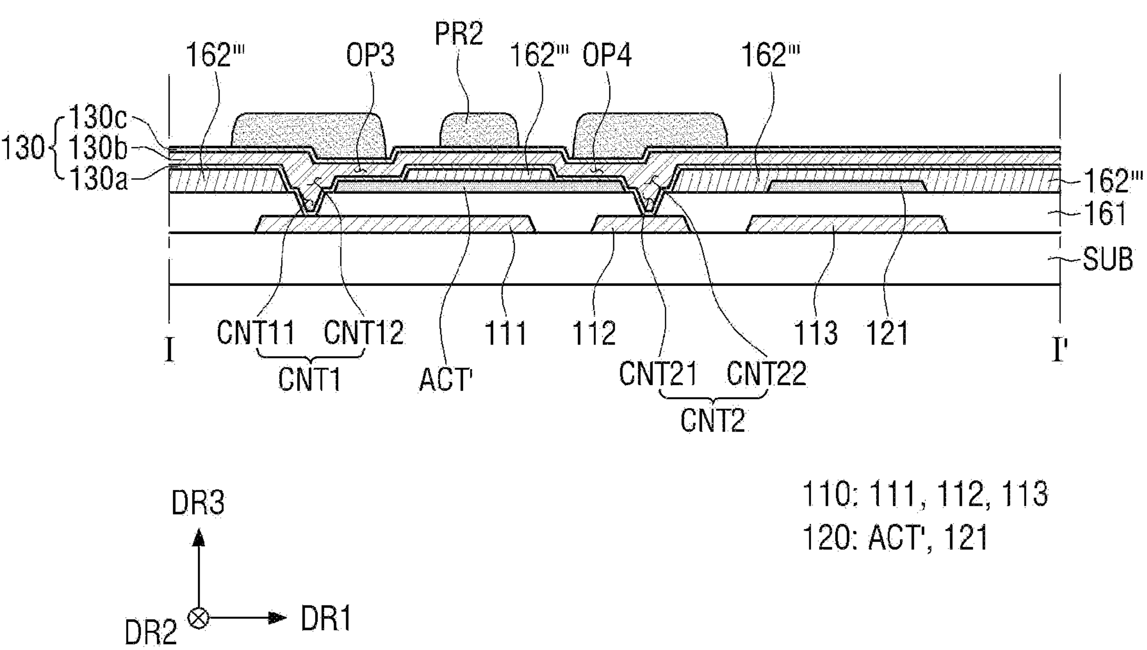
Figure 26:
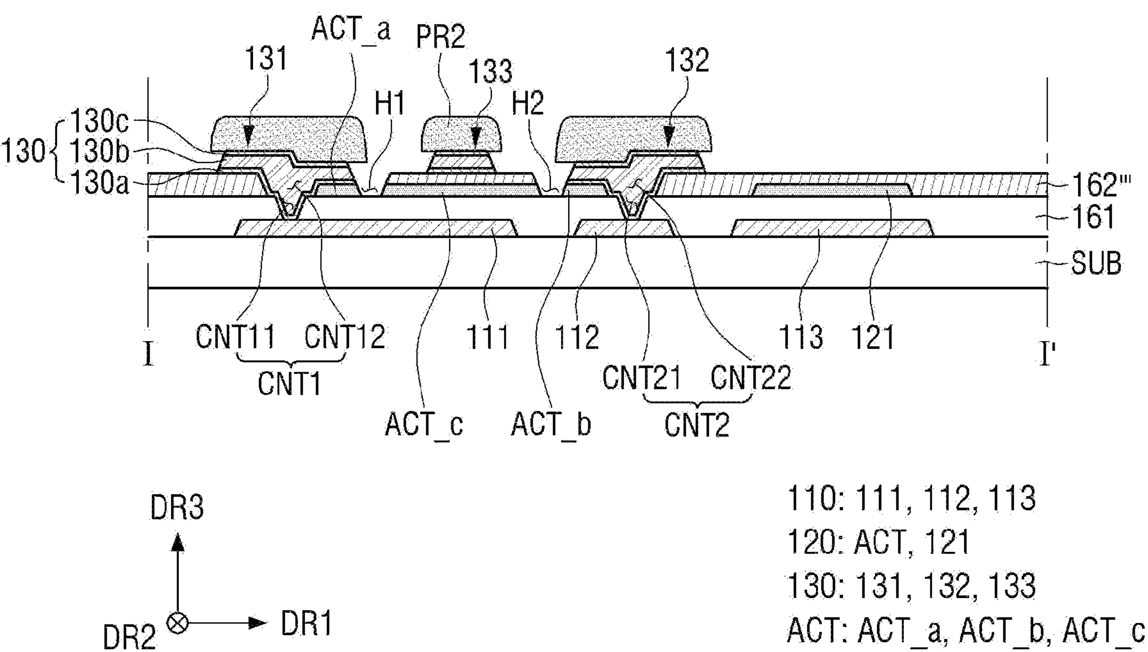

Thereafter, referring to FIGS. 24 to 26, the patterned second conductive layer 130 is formed on the second insulating layer 162'". The patterned second conductive layer 130 may be formed by a mask process. For example, as shown in FIG. 25, a material layer **130*a* for the base layer, a material layer 130*b* for the main metal layer, and a material layer 130*c* for the capping layer are sequentially deposited on the entire surface of the second insulating layer 162'". In the deposition process, the material layer 130*a* for the base layer, the material layer 130*b* for the main metal layer, and the material layer 130*c* for the capping layer may also be deposited into the first contact hole CNT1 and the second contact hole CNT2 to be connected to the first pattern 111 and the second pattern 112. Subsequently, a photoresist layer may be coated on the material layer 130*c* for the capping layer, and a second mask pattern PR2 is formed through exposure and development. Then, by etching the material layer 130*c* for the capping layer, the material layer 130*c* for the main metal layer, and the material layer 130*a* for the base layer using the second mask pattern PR2 as an etching mask, the second conductive layer 130 which is patterned as shown in FIG. 26** may be formed.

Through this etching process, not only the material layer **130*a* for the base layer, the material layer 130*b* for the main metal layer, and the material layer 130*c* for the capping layer, but a portion of the active pattern ACT may also be etched. Accordingly, a portion of the active pattern ACT may be removed, so that the first and second active holes H1 and H2 of the active pattern ACT are formed. The etching process in this step may be a wet etching process using an etching solution having reactivity with respect to the materials included in the second conductive layer 130**.

Figure 27:
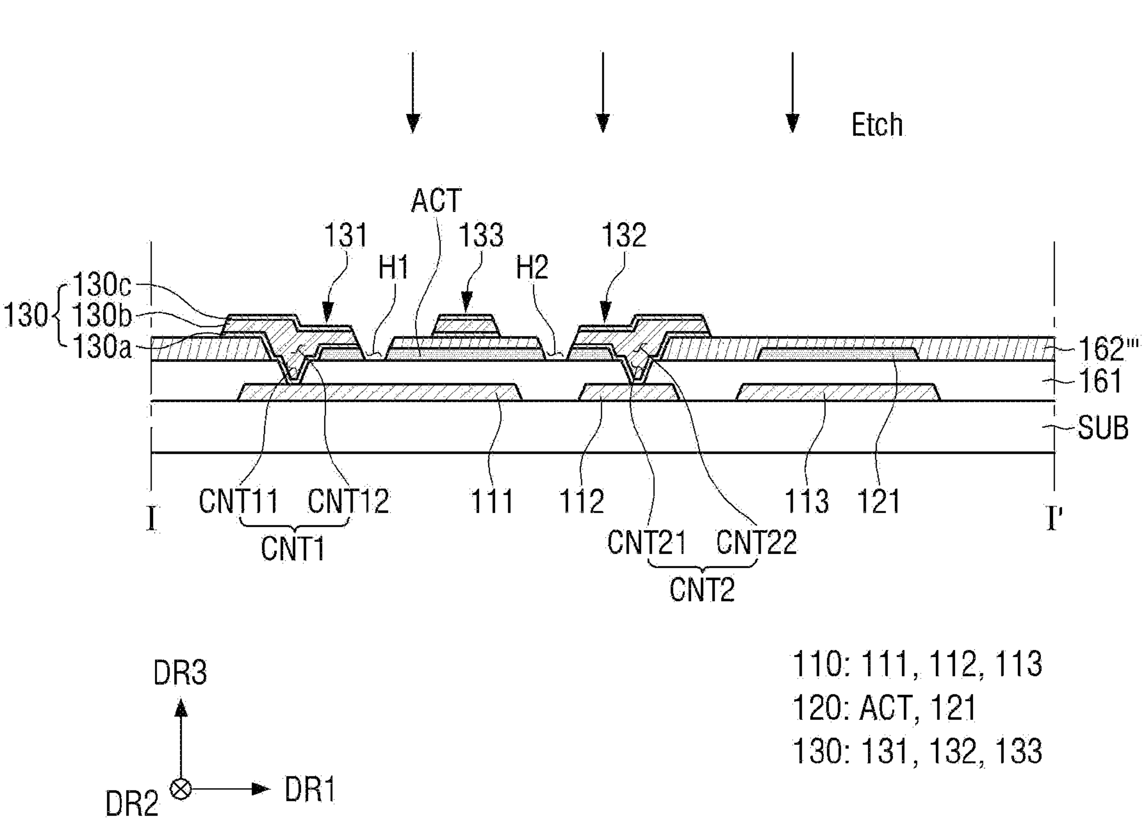
Figure 28:
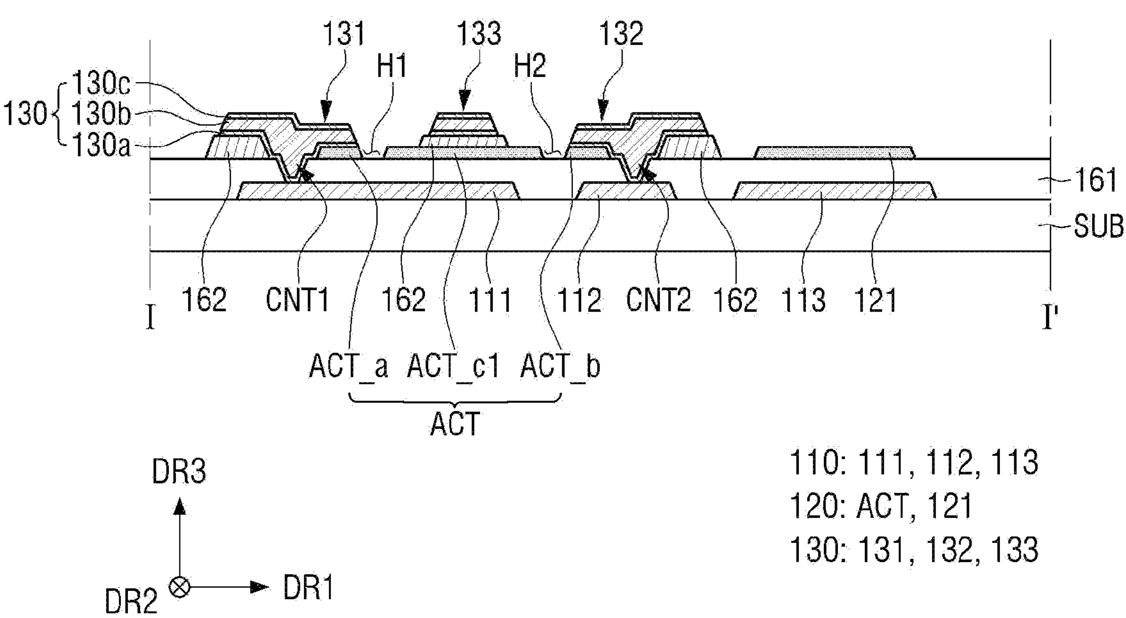

Then, referring to FIGS. 27 and 28, a portion of the second insulating layer 162''' exposed by the second conductive layer 130 is removed to form the second insulating layer 162 which is patterned as shown in FIG. 28.

Figure 29:
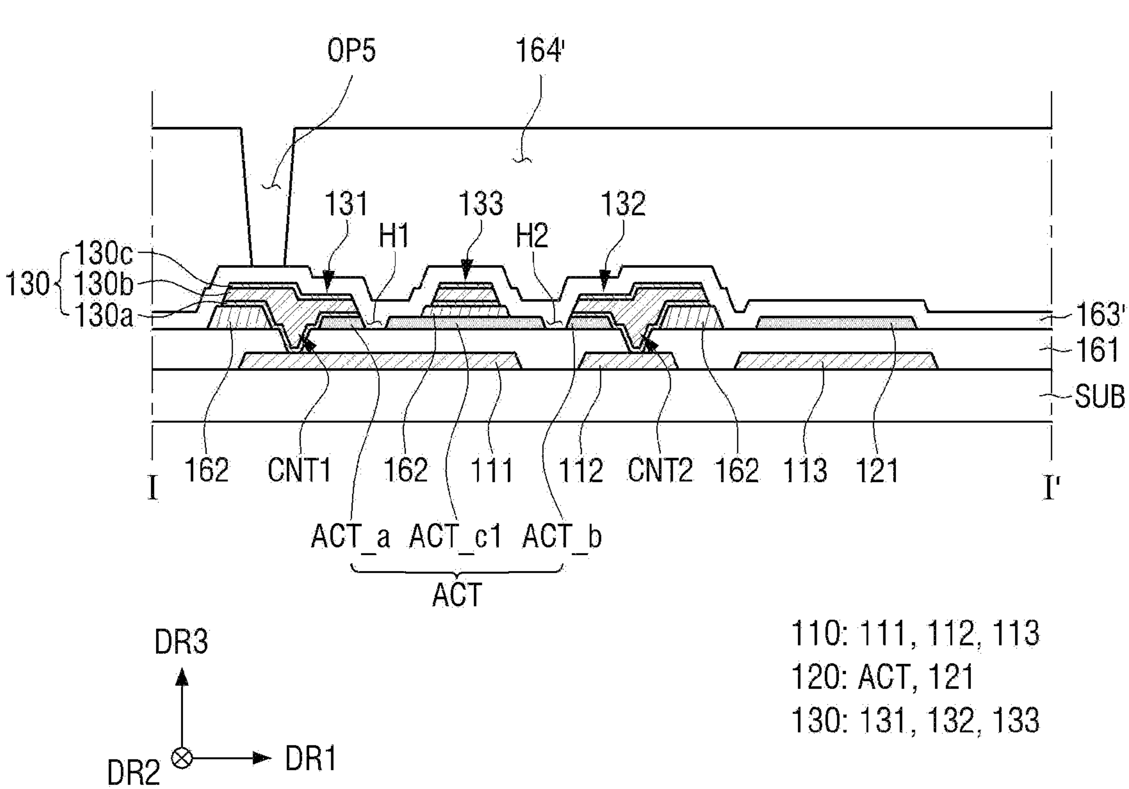

Next, referring to FIG. 29, a third insulating layer 163' is formed on the entire surface of the second insulating layer 162 on which the patterned second conductive layer 130 is formed. Thereafter, a patterned via layer 164' is formed on the third insulating layer 163'. The patterned via layer 164' may be formed by a mask process. The patterned via layer 164' may include an opening OP5 overlapping the first source/drain electrode 131. Also, the patterned via layer 164' may have a generally planar surface.

The via layer 164' may include, for example, an organic material including a photosensitive material. In this case, the patterned via layer 164' may be formed by forming the opening OP5 through exposure and development after applying an organic material layer for the via layer.

Figure 30:
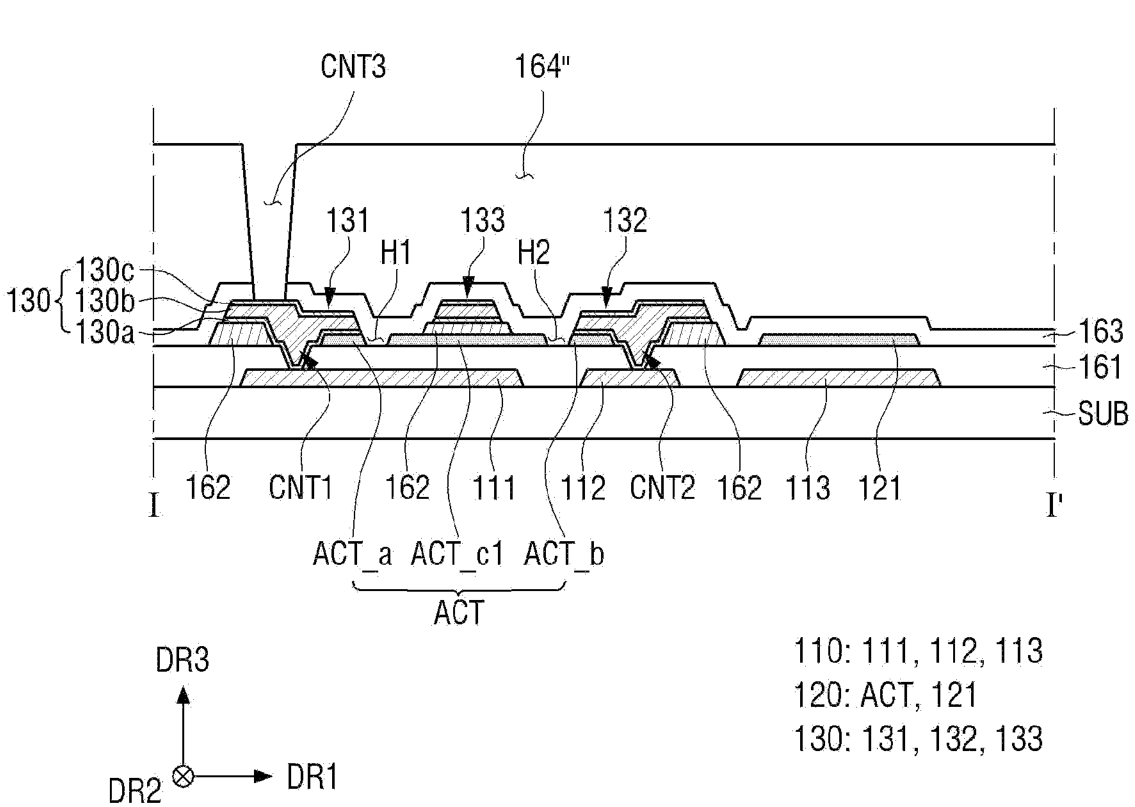

Next, referring to FIG. 30, the third insulating layer 163 is etched using the patterned via layer 164' as an etching mask to form the third contact hole CNT3 that penetrates the via layer 164" and the third insulating layer 163. In the present etching process, because the process of forming the contact hole penetrating the third insulating layer 163 is performed using the patterned via layer 164' as the etching mask, an additional mask process is not required, so that the efficiency of the fabricating process of the display device 1 can be improved.

Figure 31:
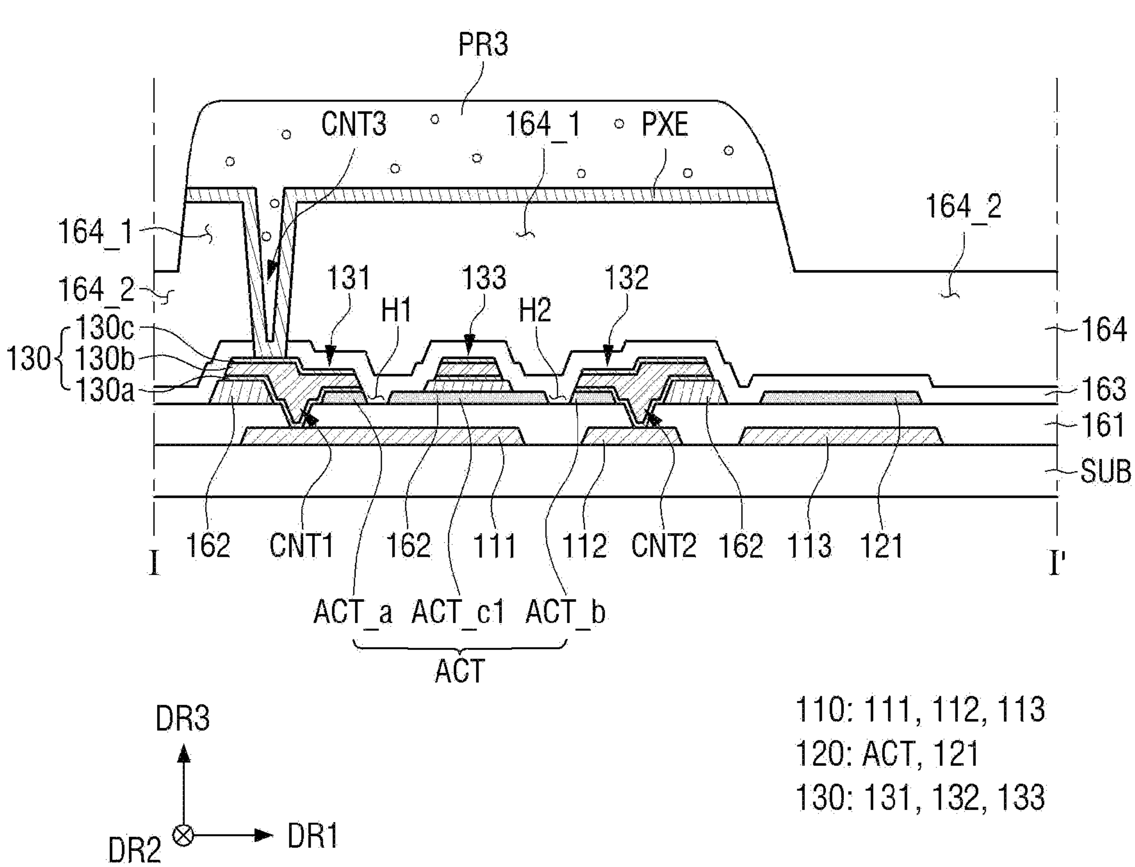

Thereafter, referring to FIG. 31, the patterned pixel electrode PXE is formed on the via layer 164. The patterned pixel electrode PXE may be formed by a mask process. To elaborate, a material layer for the pixel electrode is deposited on the entire surface of the patterned via layer 164" of FIG. 30. In this deposition process, the material layer for the pixel electrode may also be deposited into the third contact hole CNT3 to be connected to the first source/drain electrode 131.

Then, a photoresist layer is applied on the material layer for the pixel electrode, and a third mask pattern PR3 having a target pattern shape of the pixel electrode PXE is formed through exposure and development. Then, the material layer for the pixel electrode is etched using the third mask pattern PR3 as an etching mask. The etching of the material layer for the pixel electrode is may be carried out by wet etching, but is not limited thereto.

Subsequently, by performing full surface etching while the third mask pattern PR3 remains on the pixel electrode PXE, the via layer 164 including the first portion 164_1 with the first height and the second portion 164_2 with the second height lower than the first height is formed.

Next, by removing the third mask pattern PR3 through a process such as stripping, the display device 1 as shown in FIG. 7 is obtained.

Figure 32:
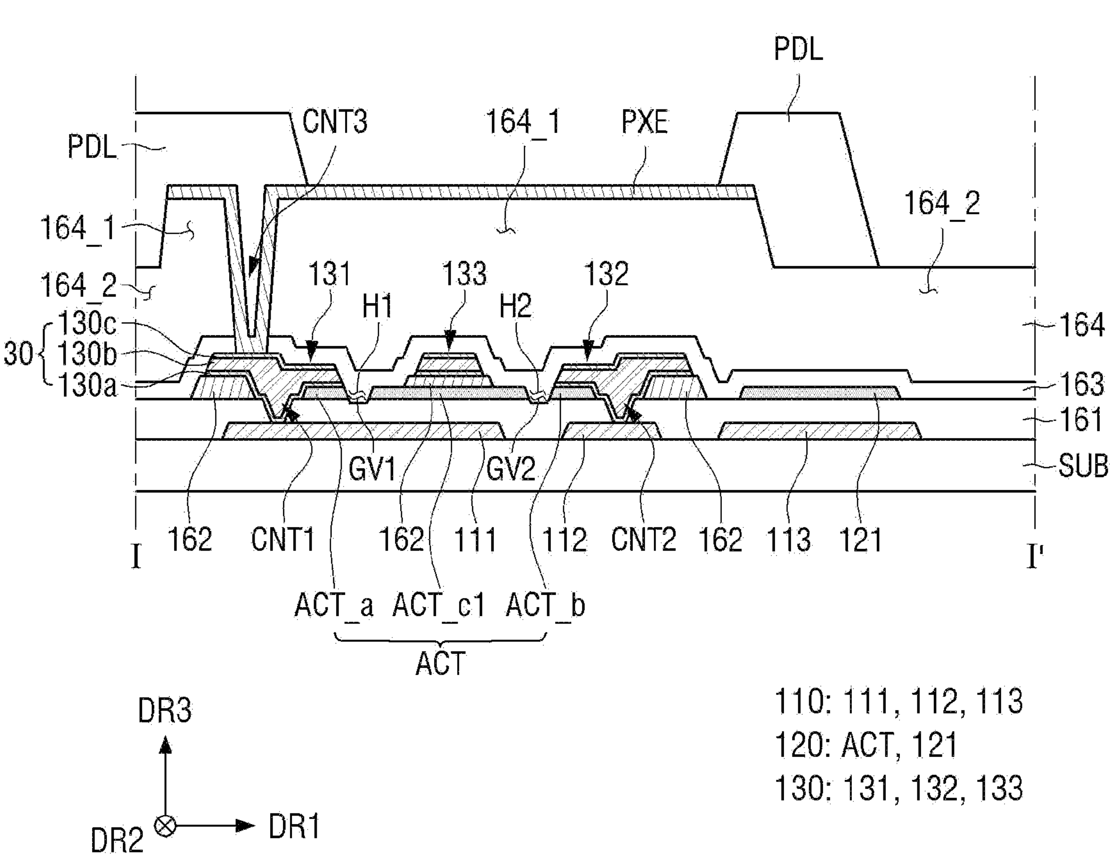
FIG. 32 is a cross-sectional view of another example of a display device taken along the line I-I' of FIG. 5 according to some embodiments.

FIG. 32 is a cross-sectional view of another example of a display device taken along the line I-I' of FIG. 5.

Referring to FIG. 32, the display device 1 according to the present embodiments is different from the embodiments described with respect to FIG. 7 in that the first insulating layer 161 overlapping the first and second active holes H1 and H2 of the active pattern ACT is recessed to form a first groove GV1 and a second groove GV2.

For example, the first and second grooves GV1 and GV2 may be a structure formed as a portion of the first insulating layer 161 is partially etched so that the top surface thereof is recessed to the other side of the third direction DR3. The first groove GV1 may be a portion of the first insulating layer 161 exposed by the first active hole H1 and recessed toward the first substrate SUB. The second groove GV2 may be a portion of the first insulating layer 161 exposed by the second active hole H2 and recessed toward the first substrate SUB.

The first active hole H1 may be positioned in an upper portion of the first groove GV1, and the second active hole H2 may be positioned in an upper portion of the second groove GV2. That is, the first groove GV1 and the first active hole H1 may be spatially connected, and the second groove GV2 and the second active hole H2 may be spatially connected. The display device 1 according to the present embodiments may be formed as a portion of the first insulating layer 161 exposed by the first and second active holes H1 and H2 of the active pattern ACT is etched as a result of the over-etching of the active pattern ACT which is etched along with the second conductive layer 130 in the process of patterning the second conductive layer 130 in the fabricating process of the display device 1.

However, the aspects of the present disclosure are not restricted to those explicitly set forth herein. The above and other aspects of the present disclosure will become more apparent to one of daily skill in the art to which the present disclosure pertains by referencing the claims, with equivalents thereof to be included therein.

What is claimed is:

1. A display device comprising:

a substrate;

a first conductive layer on the substrate and including a first pattern;

a first insulating layer on the first conductive layer;

a semiconductor layer on the first insulating layer and including an active pattern;

a second insulating layer on the semiconductor layer and the first insulating layer; and a second conductive layer on the second insulating layer, wherein the second conductive layer includes a first electrode partially in contact with the active pattern, the first electrode is in contact with the first pattern by extending through a first contact hole, the active pattern comprises a first region, a second region and a third region spaced apart from each other in one direction, the first contact hole penetrates the first insulating layer and includes a first hole defined by a sidewall of the first insulating layer, and a second hole defined by a sidewall of the second region of the active pattern and a sidewall of the second insulating layer located on the first insulating layer, a width of the second hole is defined as a distance between the sidewall of the second region of the active pattern and the sidewall of the second insulating layer located on the first insulating layer in the one direction, the width of the second hole is greater than a width of the first hole in the one direction, and the second region of the active pattern is between the second insulating layer located on the first region of the active pattern and the second insulating layer located on the first insulating layer in the one direction.

2. The display device of claim 1, wherein the active pattern exposes a portion of a top surface of the first insulating layer in a region around the first hole, and the first electrode is in contact with a top surface of the first insulating layer exposed by the active pattern.

3. The display device of claim 2, wherein a sidewall of the second insulating layer defining the second hole is on a top surface of the first insulating layer exposed by the active pattern in a region around the first hole, and a top surface of the first insulating layer exposed by the active pattern is between a sidewall of the first insulating layer defining the first hole and a sidewall of the second insulating layer defining the second hole in a plan view.

4. The display device of claim 3, wherein the second insulating layer exposes a portion of a top surface of the first insulating layer in a region around the first hole, and the first electrode is in contact with a top surface of the first insulating layer exposed by the second insulating layer.

5. The display device of claim 1, wherein the first electrode is in direct contact with a sidewall of the second insulating layer and a sidewall of the active pattern defining the second hole.

6. The display device of claim 1, wherein a sidewall of the first insulating layer defining the first hole has a positive taper shape.

7. The display device of claim 6, wherein an inclination angle of a sidewall of the first insulating layer defining the first hole is an acute angle of 70° or less.

8. The display device of claim 7, wherein a sidewall of the first insulating layer defining the first hole includes a first sidewall on a side of the active pattern and a second sidewall on a side of the second insulating layer in cross-sectional view, and an inclination angle of the first sidewall and an inclination angle of the second sidewall are the same.

9. The display device of claim 1, wherein the first conductive layer further includes a second pattern spaced apart from the first pattern, the second conductive layer further includes:

a gate electrode overlapping the active pattern and spaced apart from the first electrode; and a second electrode spaced apart from the first electrode and the gate electrode and in contact with the active pattern, the second electrode is in contact with the second pattern through a second contact hole, the second contact hole includes a third hole penetrating the first insulating layer and defined by a sidewall of the first insulating layer, and a fourth hole defined by a sidewall of the active pattern and a sidewall of the second insulating layer, and a width of the fourth hole is greater than a width of the third hole.

10. The display device of claim 9, wherein a sidewall of the active pattern defining the fourth hole is on a top surface of the first insulating layer exposed by the active pattern in a region around the third hole, and the top surface of the first insulating layer exposed by the active pattern is between a sidewall of the first insulating layer defining the third hole and the sidewall of the active pattern defining the fourth hole in a plan view.

11. The display device of claim 9, wherein the active pattern includes a first region in contact with the first electrode, a second region in contact with the second electrode, and a third region between the first region and the second region, the second insulating layer is not between the first region and the first electrode, the second insulating layer is not between the second region and the second electrode.

12. The display device of claim 1, wherein the first hole completely overlaps the second hole in a plan view.

13. The display device of claim 12, wherein the first hole does not overlap the active pattern in a thickness direction of the substrate.

14. The display device of claim 1, wherein the first hole and the second hole are spatially connected.

15. A display device comprising:

a substrate;

a first pattern on the substrate;

a first insulating layer on the first pattern;

an active pattern on the first insulating layer;

a second insulating layer on the active pattern and the first insulating layer; and a first electrode on the second insulating layer and partially overlapping the first pattern and the active pattern, respectively, wherein the first electrode is in contact with the first pattern by extending through a first hole penetrating the first insulating layer and a second hole defined by the active pattern and the second insulating layer, the active pattern comprises a first region, a second region and a third region spaced apart from each other in one direction, the first hole is located inside the second hole in a plan view, an edge of the first hole is not in contact with an edge of the second hole, and a width of the second hole is defined as a distance between the sidewall of the second region of the active pattern and the sidewall of the second insulating layer located on the first insulating layer in the one direction, and the width of the second hole is greater than a width of the first hole in the one direction, and the second region of the active pattern is between the second insulating layer located on the first region of the active pattern and the second insulating layer located on the first insulating layer in the one direction.

16. The display device of claim 15, wherein the second hole is configured to expose a portion of a top surface of the first insulating layer in a region around the first hole.

17. The display device of claim 16, wherein the first electrode is in contact with a top surface of the first insulating layer exposed by the second hole.

18. The display device of claim 16, wherein the first electrode is in contact with a sidewall of the active pattern defining the second hole.

19. The display device of claim 15, wherein a sidewall of the active pattern defining the second hole is on a top surface of the first insulating layer exposed by the active pattern in a region around the first hole, and a top surface of the first insulating layer exposed by the active pattern is between a sidewall of the first insulating layer defining the first hole and a sidewall of the active pattern defining the second hole in a plan view, and wherein a sidewall of the second insulating layer defining the second hole is on a top surface of the first insulating layer exposed by the active pattern in a region around the first hole, and a top surface of the first insulating layer exposed by the active pattern is between a sidewall of the first insulating layer defining the first hole and a sidewall of the second insulating layer defining the second hole in a plan view.

20. The display device of claim 15, wherein a sidewall of the first insulating layer defining the first hole has an acute angle of inclination.

* * * * *